United States Patent
Yeh et al.

(10) Patent No.: US 10,629,608 B2
(45) Date of Patent: Apr. 21, 2020

(54) 3D VERTICAL CHANNEL TRI-GATE NAND MEMORY WITH TILTED HEMI-CYLINDRICAL STRUCTURE

(71) Applicant: MACRONIX INTERNATIONAL CO., LTD., Hsinchu (TW)

(72) Inventors: Teng-Hao Yeh, Zhubei (TW); Hang-Ting Lue, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/142,901

(22) Filed: Sep. 26, 2018

(65) Prior Publication Data

US 2020/0098774 A1   Mar. 26, 2020

(51) Int. Cl.
  *H01L 27/11565*   (2017.01)
  *H01L 27/11582*   (2017.01)
  *H01L 27/1157*    (2017.01)

(52) U.S. Cl.
  CPC .... *H01L 27/11565* (2013.01); *H01L 27/1157* (2013.01); *H01L 27/11582* (2013.01)

(58) Field of Classification Search
  CPC ......... H01L 27/11565; H01L 27/11582; H01L 27/1157
  See application file for complete search history.

(56) References Cited

U.S. PATENT DOCUMENTS

| | | |
|---|---|---|
| 6,852,453 B2 | 2/2005 | Wu |
| 6,906,940 B1 | 6/2005 | Lue |
| 7,315,474 B2 | 1/2008 | Lue |
| 7,420,242 B2 | 9/2008 | Lung |
| 7,696,559 B2 | 4/2010 | Arai et al. |
| 7,851,849 B2 | 12/2010 | Kiyotoshi |
| 8,008,732 B2 | 8/2011 | Kiyotoshi et al. |
| 8,363,476 B2 | 1/2013 | Lue et al. |

(Continued)

FOREIGN PATENT DOCUMENTS

| | | |
|---|---|---|
| EP | 2048709 A2 | 4/2009 |
| TW | 548710 B | 8/2003 |

(Continued)

OTHER PUBLICATIONS

Y.X. Liu et al., "Comparative Study of Tri-Gate and Double-Gate-Type Poly-Si Fin-Channel Spli-Gate Flash Memories," 2012 IEEE Silicon Nanoelectronics Workshop (SNW), Honolulu, HI, Jun. 10-11, 2012, pp. 1-2.

(Continued)

*Primary Examiner* — Anthony Ho
(74) *Attorney, Agent, or Firm* — Haynes Beffel & Wolfeld LLP

(57) ABSTRACT

A memory device comprises a stack of conductive strips separated by insulating strips, the conductive strips in the stack extending in a first direction. The memory device comprises a plurality of hemi-cylindrical vertical channel structures extending through the conductive strips in the stack, each of the hemi-cylindrical vertical channel structures having a divided elliptical cross section with a major axis tilted relative to the first direction. The memory device comprises data storage structures on the sidewalls of the conductive strips. The hemi-cylindrical vertical channel structures comprise semiconductor films having outside surfaces in contact with the data storage structures on the sidewalls of the conductive strips.

20 Claims, 21 Drawing Sheets

(56) References Cited

U.S. PATENT DOCUMENTS

| | | | |
|---|---|---|---|
| 8,467,219 | B2 | 6/2013 | Lue |
| 8,503,213 | B2 | 8/2013 | Chen et al. |
| 8,648,438 | B2 | 2/2014 | Cai et al. |
| 8,759,899 | B1 | 6/2014 | Lue et al. |
| 8,853,818 | B2 | 10/2014 | Lue |
| 9,147,468 | B1 | 9/2015 | Lue |
| 9,287,291 | B2 | 3/2016 | Lue |
| 9,391,084 | B2 | 7/2016 | Lue |
| 9,397,110 | B2 | 7/2016 | Lue |
| 9,412,752 | B1 | 8/2016 | Yeh et al. |
| 9,520,485 | B2 | 12/2016 | Lue |
| 9,524,980 | B2 | 12/2016 | Lue |
| 9,698,156 | B2 | 7/2017 | Lue |
| 10,211,218 | B2 | 2/2019 | Lue |
| 2005/0280061 | A1 | 12/2005 | Lee |
| 2007/0045708 | A1 | 3/2007 | Lung |
| 2007/0158736 | A1 | 7/2007 | Arai et al. |
| 2007/0252201 | A1 | 11/2007 | Kito et al. |
| 2008/0073635 | A1 | 3/2008 | Kiyotoshi et al. |
| 2008/0175032 | A1 | 7/2008 | Tanaka et al. |
| 2008/0180994 | A1 | 7/2008 | Katsumata et al. |
| 2009/0097321 | A1 | 4/2009 | Kim et al. |
| 2009/0184360 | A1 | 7/2009 | Jin et al. |
| 2010/0270593 | A1 | 10/2010 | Lung et al. |
| 2011/0018051 | A1 | 1/2011 | Kim et al. |
| 2011/0140070 | A1 | 6/2011 | Kim |
| 2012/0068241 | A1 | 3/2012 | Sakuma et al. |
| 2012/0119283 | A1 | 5/2012 | Lee et al. |
| 2012/0147644 | A1 | 6/2012 | Scheuerlein |
| 2012/0182806 | A1 | 7/2012 | Chen et al. |
| 2013/0009235 | A1 | 1/2013 | Yoo |
| 2013/0119455 | A1 | 5/2013 | Chen et al. |
| 2013/0134492 | A1 | 5/2013 | Yang et al. |
| 2013/0207178 | A1 | 8/2013 | Lee et al. |
| 2013/0248956 | A1 | 9/2013 | Kim |
| 2014/0097484 | A1 | 4/2014 | Seol et al. |
| 2014/0231954 | A1 | 8/2014 | Lue |
| 2014/0264541 | A1 | 9/2014 | Rhie |
| 2015/0048434 | A1 | 2/2015 | Rhie |
| 2015/0263016 | A1 | 9/2015 | Cha |
| 2015/0318301 | A1 | 11/2015 | Lee et al. |
| 2015/0364487 | A1 | 12/2015 | Yun |
| 2016/0043100 | A1 | 2/2016 | Lee et al. |
| 2016/0141337 | A1 | 5/2016 | Shimabukuro et al. |
| 2016/0163734 | A1 | 6/2016 | Kim et al. |
| 2016/0247570 | A1 | 8/2016 | Chang et al. |
| 2017/0213842 | A1 | 7/2017 | Park et al. |
| 2018/0102177 | A1 | 4/2018 | Wu et al. |

FOREIGN PATENT DOCUMENTS

| | | |
|---|---|---|
| TW | 201639126 A | 11/2016 |
| WO | 2017039784 A1 | 3/2017 |

OTHER PUBLICATIONS

Chen et al., "A Highly Pitch Scalable 3D Vertical Gate (VG) NAND Flash Decoded by a Novel Self-Aligned Independently Controlled Double Gate (IDG) StringSelect Transistor (SSL)," 2012 Symp. on VLSI Technology (VLSIT), Jun. 12-14, 2012, pp. 91-92.

Choi et al., "Performance Breakthrough in NOR Flash Memory With Dopant-Segregated Schottky-Barrier (DSSB) SONOS Devices," Jun. 2009 Symposium on VLSITechnology Digest of Technical Papers, pp. 222-223.

Fukuzumi et al. "Optimal Integration and Characteristics of Vertical Array Devices for Ultra-High Density, Bit-Cost Scalable Flash Memory," IEEE Dec. 2007, pp. 449-452.

Hsu et al., "Study of Sub-30nm Thin Film Transistor (TFT) Charge-Trapping (CT) Devices for 3D NAND Flash Application," 2009 IEEE, Dec. 7-9, 2009, pp. 27.4.1-27.4.4.

Hubert et al., "A Stacked SONOS Technology, Up to 4 Levels and 6nm Crystalline Nanowires, With Gate-All-Around or Independent Gates (Flash), Suitable for Full 3D Integration," IEEE 2009, Dec. 7-9, 2009, pp. 27.6.1-27.6.4.

Hung et al., "A highly scalable vertical gate (VG) 3D NAND Flash with robust program disturb immunity using a novel PN diode decoding structure," 2011 Symp. on VLSI Technology (VLSIT), Jun. 14-16, 2011, pp. 68-69.

Jang et al., "Vertical Cell Array Using TCAT (Terabit Cell Array Transistor) Technology for Ultra High Density NAND Flash Memory," 2009 Symposium on VLSI Technology Digest of Technical Papers, Jun. 16-18, 2009, pp. 192-193.

Jung et al., "Three Dimensionally Stacked NAND Flash Memory Technology Using Stacking Single Crystal Si Layers on ILD and TANOS Structure for Beyond 30nmNode," IEEE IEDM Dec. 11-13, 2006, 4 pages.

Katsumata et al., "Pipe-shaped BiCS Flash Memory With 16 Stacked Layers and Multi-Level-Cell Operation for Ultra High Density Storage Devices," 2009 Symposium on VLSI Technology Digest of Technical Papers, Jun. 16-18, 2009, pp. 136-137.

Kim et al. "Novel Vertical-Stacked-Array-Transistor (VSAT) for Ultra-High-Density and Cost-Effective NAND Flash Memory Devices and SSD (Solid State Drive)", Jun. 2009 Symposium on VLSI Technology Digest of Technical Papers, pp. 186-187.

Kim et al., "Three-Dimensional NAND Flash Architecture Design Based on Single-Crystalline STacked ARray," IEEE Transactions on Electron Devices, vol. 59, No. 1, pp. 35-45, Jan. 2012.

Kim et al., "Multi-Layered Vertical Gate NAND Flash Overcoming Stacking Limit for Terabit Density Storage," 2009 Symposium on VLSI Technology Digest of Technical Papers, Jun. 16-18, 2009, pp. 188-189.

Kim et al., "Novel 3-D Structure for Ultra High Density Flash Memory with VRAT (Vertical-Recess-Array-Transistor) and PIPE (Planarized Integration on the same PlanE)," IEEE 2008 Symposium on VLSI Technology Digest of Technical Papers, Jun. 17-19, 2008, pp. 122-123.

Lai et al., "A Multi-Layer Stackable Thin-Film Transistor (TFT) NAND-Type Flash Memory," Electron Devices Meeting, 2006, IEDM '06 International, Dec. 11-13, 2006, pp. 1-4.

Lue et al., "A Highly Scalable 8-Layer 3D Vertical-Gate (VG) TFT NAND Flash Using Junction-Free Buried Channel BE-SONOS Device", 2010 Symposium on VLSI Technology Digest of Technical Papers, pp. 131-132, Jun. 15-17, 2010.

Nowak et al., "Intrinsic fluctuations in Vertical NAND flash memories," 2012 Symposium on VLSI Technology, Digest of Technical Papers, pp. 21-22, Jun. 12-14, 2012.

Tanaka et al., "Bit Cost Scalable Technology with Punch and Plug Process for Ultra High Density Flash Memory," VLSI Technology, 2007 IEEE Symposium on Jun. 12-14, 2007, pp. 14-15.

Wang, Michael, "Technology Trends on 3D-NAND Flash Storage", Impact 2011, Taipei, dated Oct. 20, 2011, found at www.impact.org.tw/2011/Files/NewsFile/201111110190.pdf.

U.S. Appl. No. 14/637,187—Office Action dated May 19, 2016, 21 pages.

TW Office Action in Application No. TW 107138971 dated Oct. 3, 2019, 10 pages.

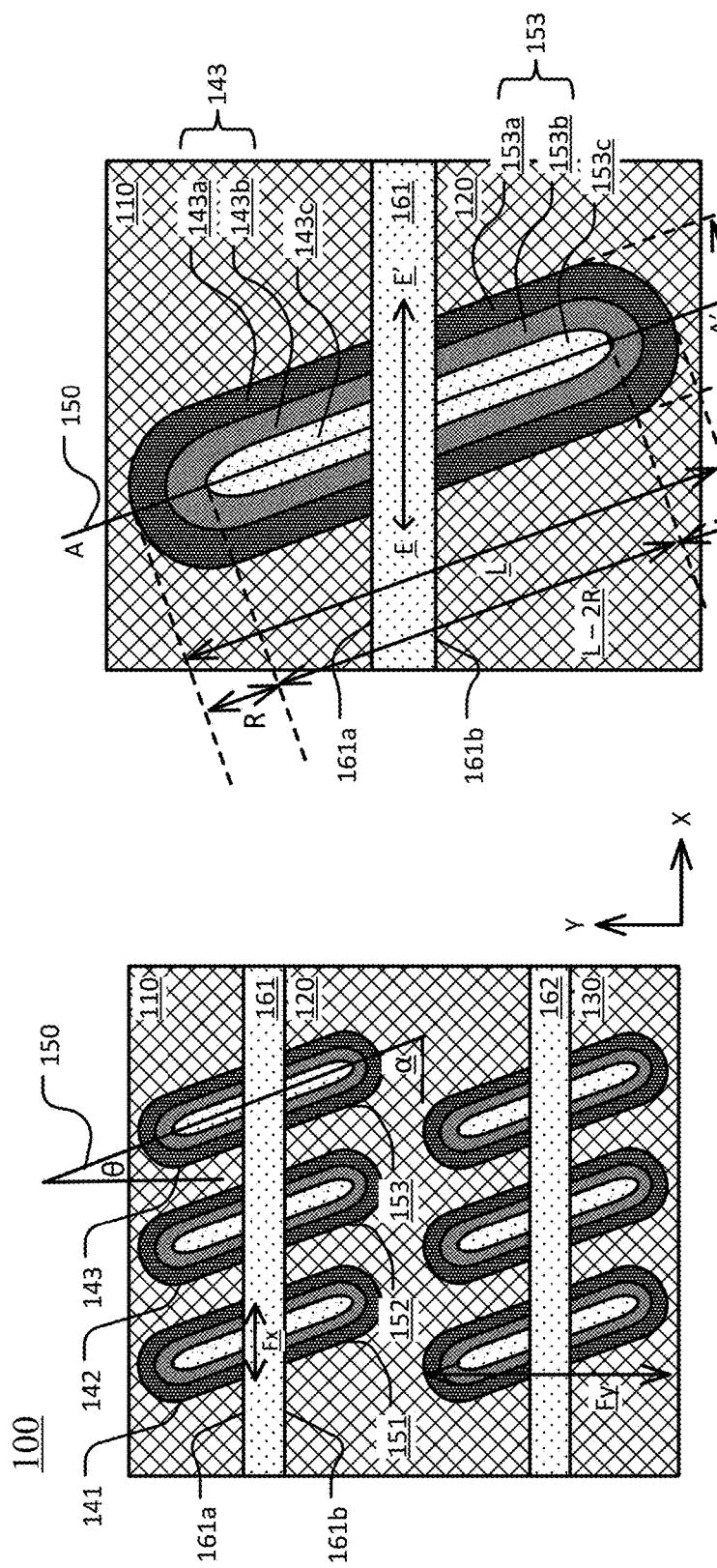
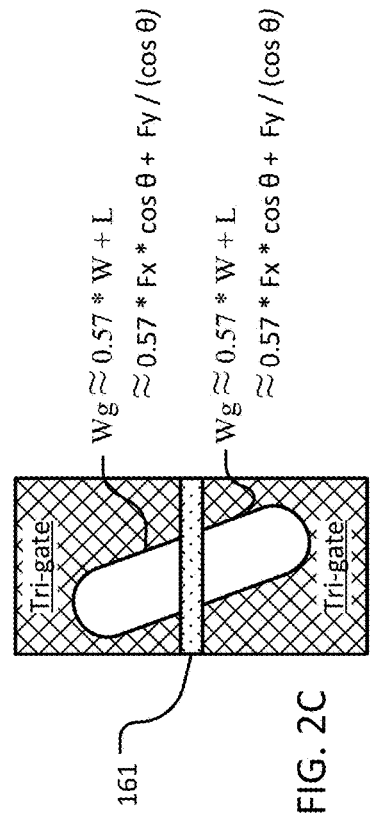
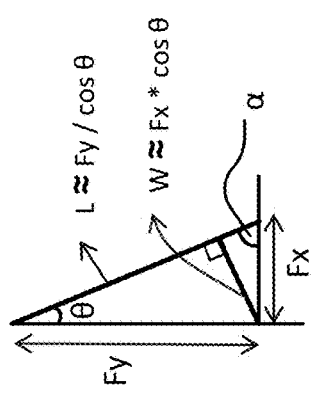
FIG. 2
FIG. 2A
FIG. 2B
FIG. 2C

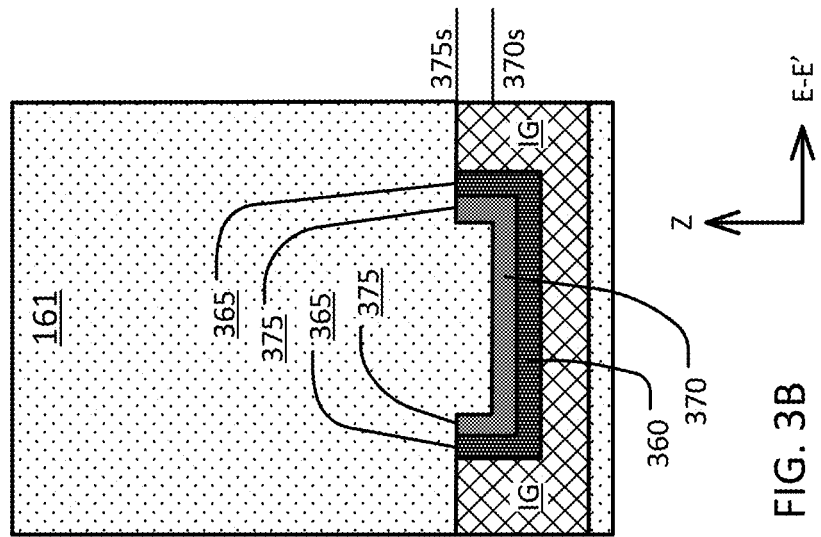
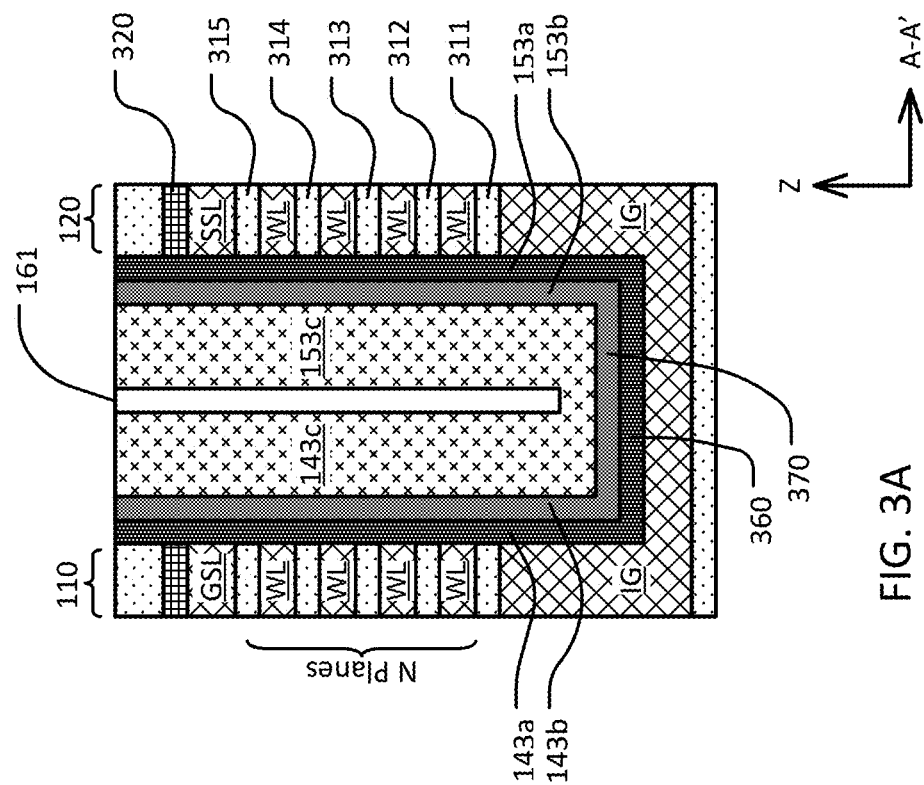

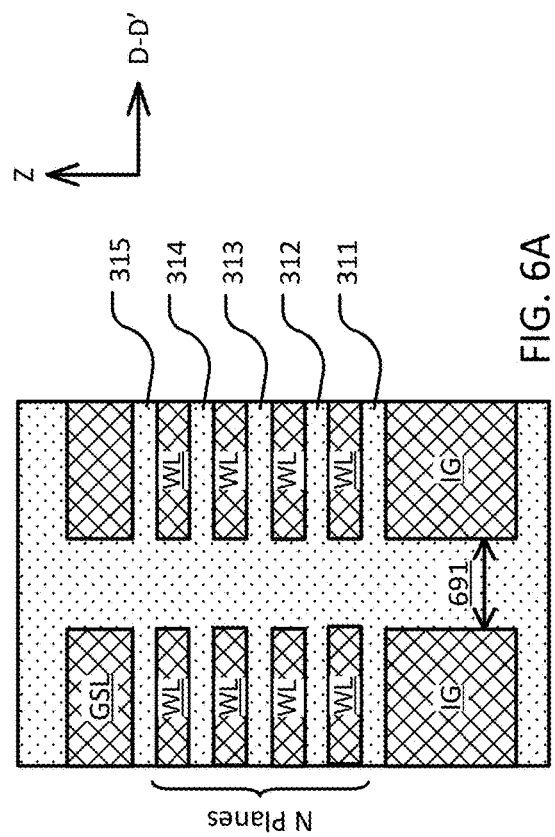
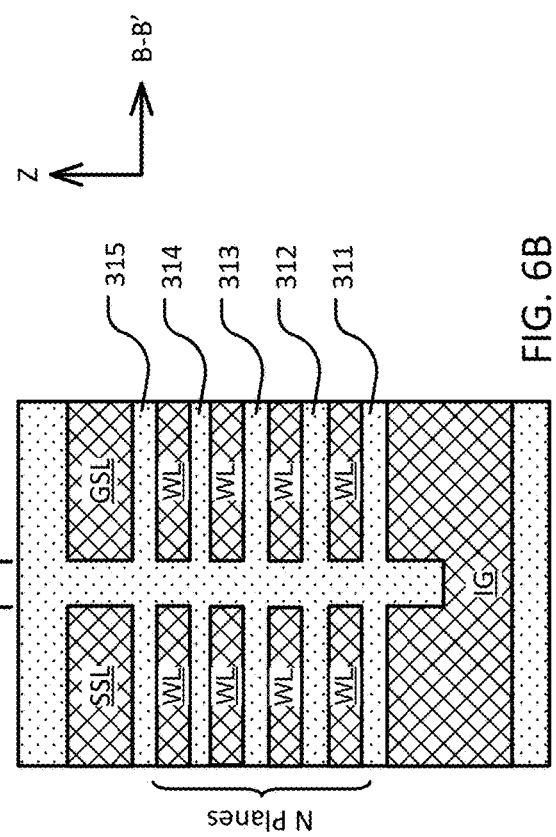
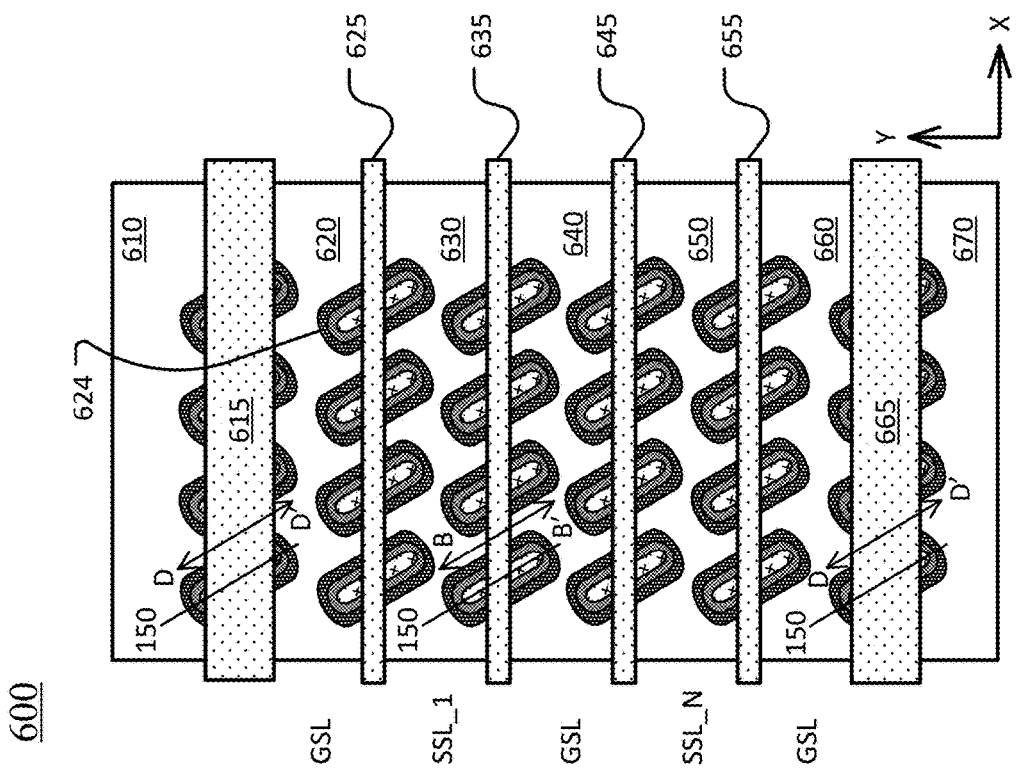

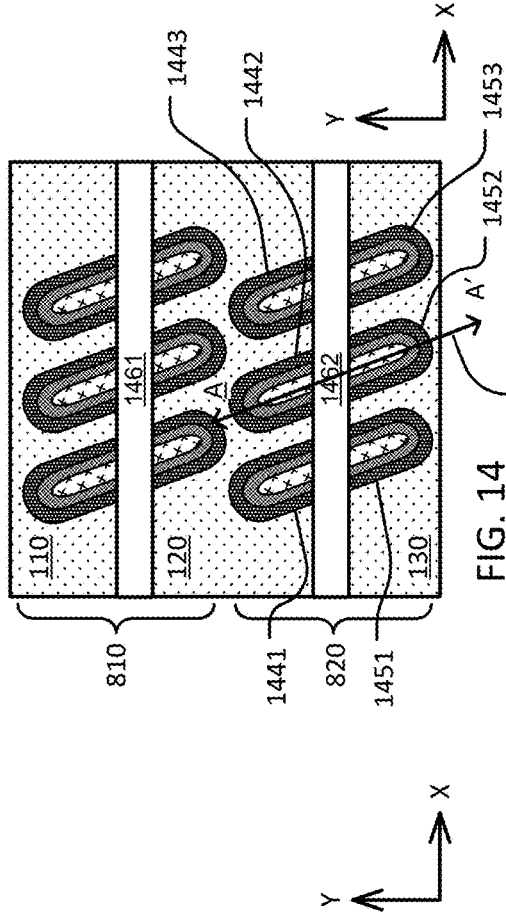
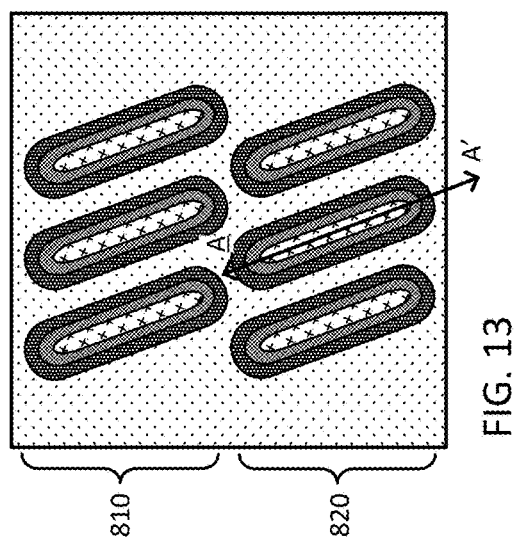
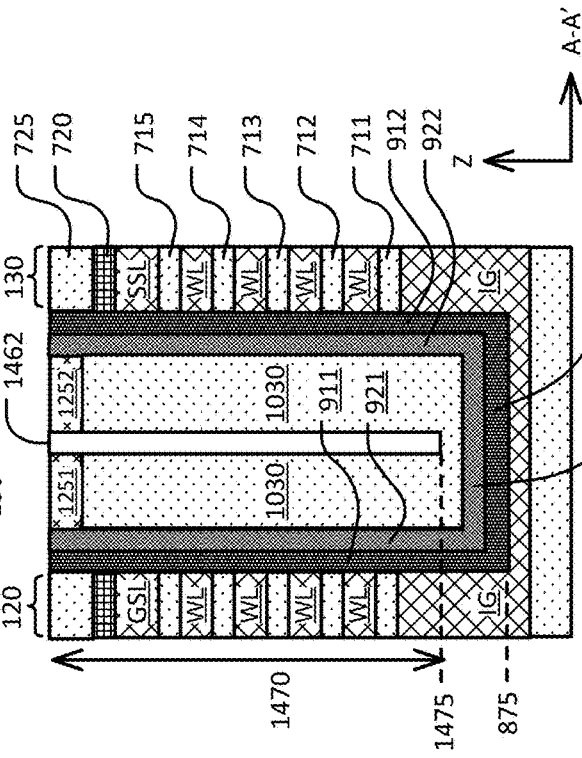
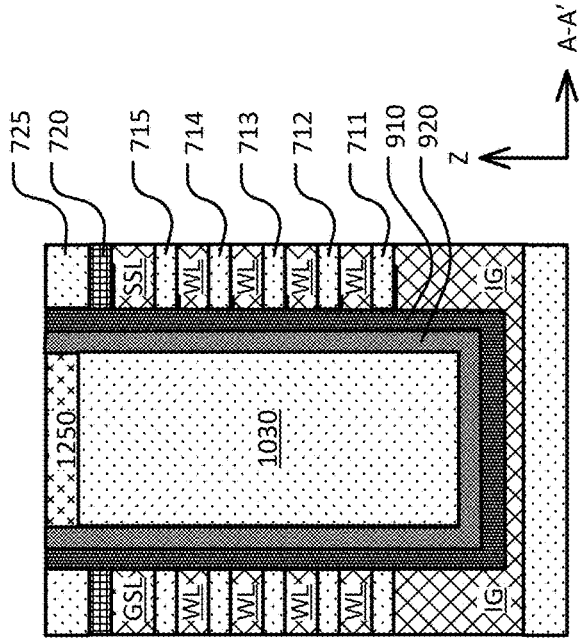

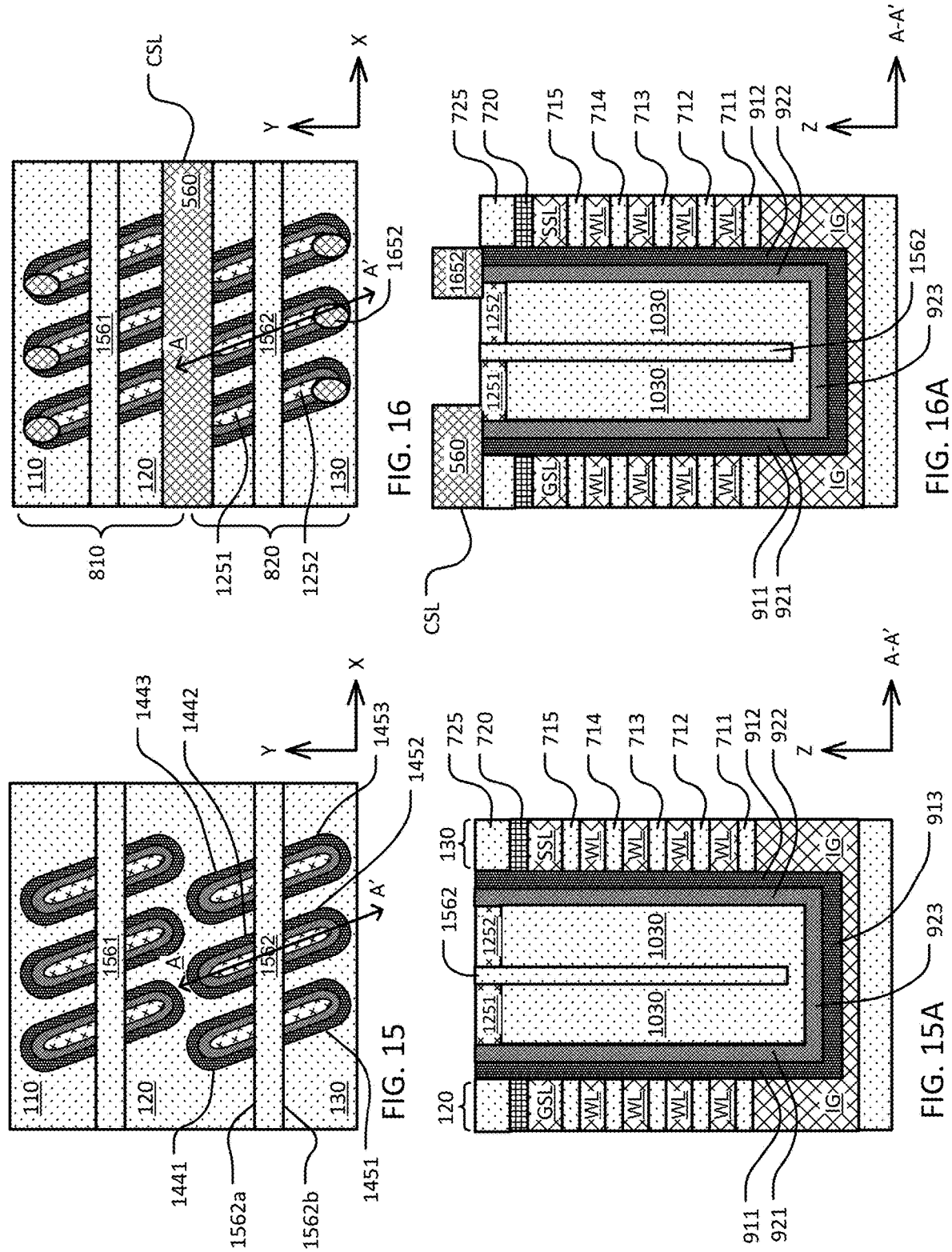

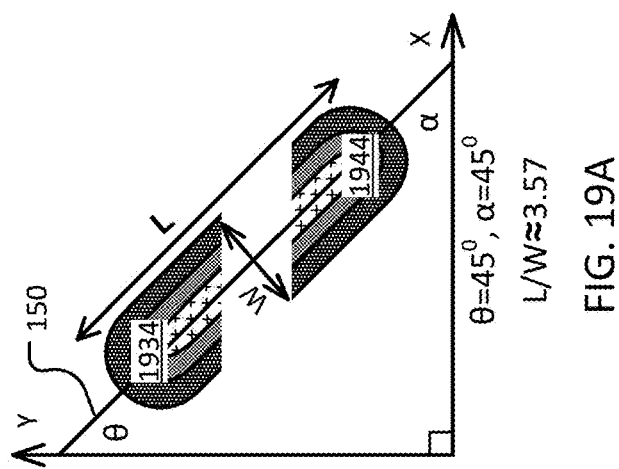
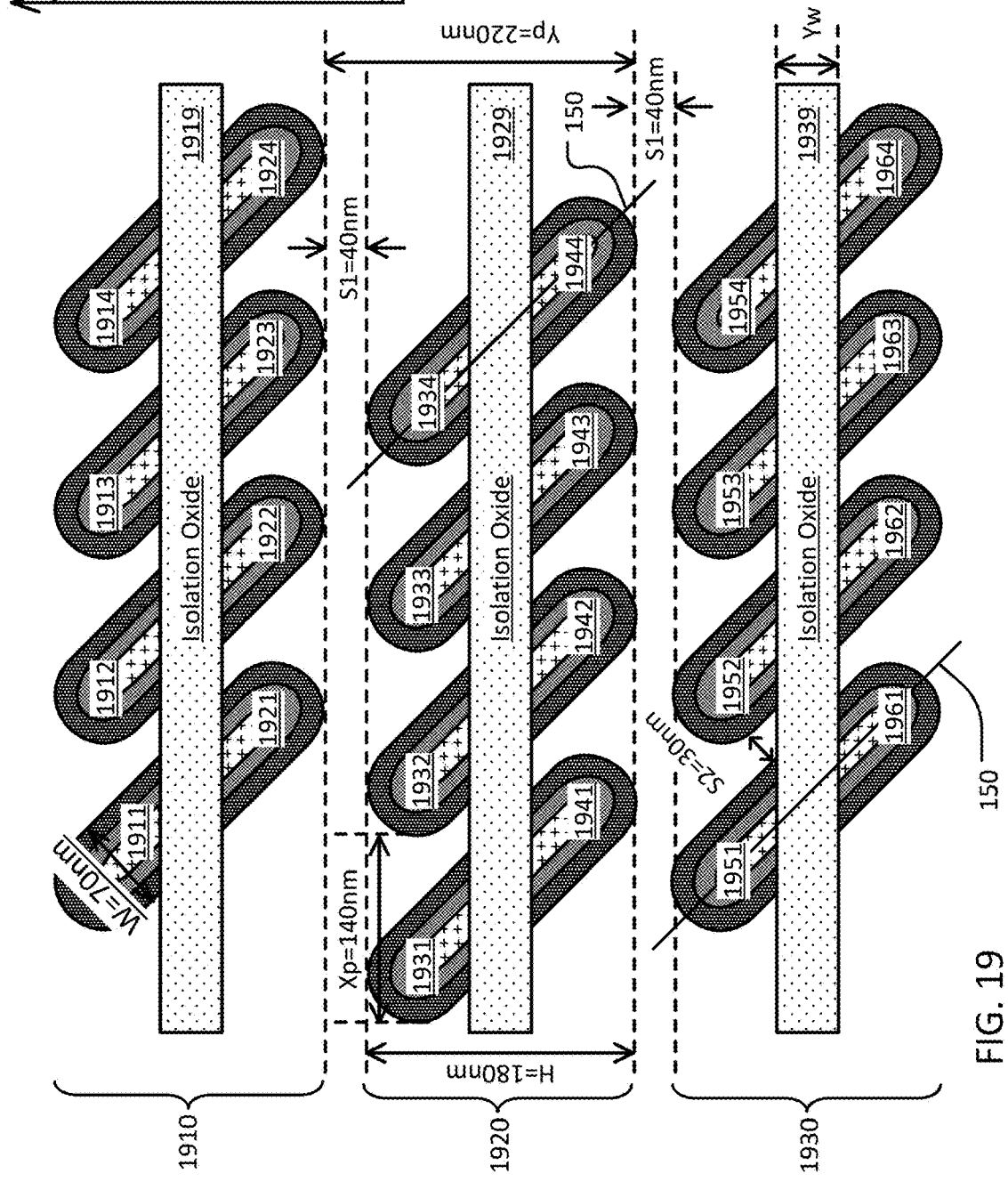
FIG. 19A
FIG. 19

3D VERTICAL CHANNEL TRI-GATE NAND MEMORY WITH TILTED HEMI-CYLINDRICAL STRUCTURE

BACKGROUND

Field

The present invention relates to high density memory devices, and particularly to memory devices in which multiple planes of memory cells are arranged to provide a three-dimensional 3D array.

Description of Related Art

As critical dimensions of devices in integrated circuits shrink to the limits of common memory cell technologies, designers have been looking to techniques for stacking multiple planes of memory cells to achieve greater storage capacity, and to achieve lower costs per bit.

In a single gate and flat channel structure, the gate controllability is limited by the gate width, the turn on current is limited by the channel width, and there is Y-interference between opposite cells on sidewalls of the structure.

It is desirable to provide a structure for three-dimensional integrated circuit memory with an enlarged channel width, better gate controllability, and reduced Y-interference.

SUMMARY

A memory device comprises a stack of conductive strips separated by insulating strips, the conductive strips in the stack extending in a first direction (X-direction). The memory device comprises a plurality of hemi-cylindrical vertical channel structures extending through the conductive strips in the stack, each of the hemi-cylindrical vertical channel structures having a divided elliptical cross section with a major axis tilted relative to the first direction. The memory device comprises data storage structures on the sidewalls of the conductive strips. The hemi-cylindrical vertical channel structures comprise semiconductor films having outside surfaces in contact with the data storage structures on the sidewalls of the conductive strips.

A circuit is described that comprises a 3D array of vertical NAND strings, where the NAND strings include tri-gate memory cells, such as tri-gate charge trapping memory cells.

As used herein, a hemi-cylindrical vertical channel structure has a channel material extending partially around an outside surface of a cylindrical structure that has horizontal cross-section in a divided elliptical shape, where an elliptical shape can include an ellipse, and ellipse-like shapes such as oblong, oval, polygonal, racetrack, and other shapes that are ellipse-like in the sense they can be characterized as having a major axis greater than a minor axis orthogonal to the major axis. An elliptical shape can be divided into two divided elliptical shapes referred to herein as "hemi-elliptical," in which the division may not be parallel to the minor axis, but lies along a line that is tilted at an angle to the major axis and at a complementary angle to the minor axis. A pair of hemi-cylindrical vertical channel structures have channel material on the outside surfaces of the hemi-elliptical cross sections opposite each other across an isolation block along a major axis, and has a horizontal cross-section that includes two divided hemi-elliptical shapes. The channel material does not cover the outside surface of the cylindrical structure along the dividing line at the isolation block, and is therefore termed "hemi-cylindrical."

The major axis is tilted at an angle relative to the first direction, where the angle can have a range between 30 degrees and 80 degrees. The conductive strips in the stack of conductive strips can act as tri-gates or finFET-like double-gates in contact with the hemi-cylindrical vertical channel structures.

In comparison to a single gate and flat channel structure, the present technology provides tilted hemi-cylindrical memory cells including hemi-cylindrical vertical channel structures, by extending a dimension of the hemi-cylindrical vertical channel structures in a second direction (Y-direction) orthogonal to the first direction, and by tilting a major axis of the hemi-cylindrical vertical channel structures relative to the first direction (X-direction).

Hemi-cylindrical vertical channel structures in the tilted hemi-cylindrical memory cells are arranged in a nearly wrap-around structure, to enlarge the channel width for higher turn-on current, which can make sensing circuit more stable, and to enlarge the data storage structures. Tri-gates or finFET-like double-gates in contact with the hemi-cylindrical vertical channel structures provide a wider gate width Wg than that of a single gate, to provide better gate controllability. Furthermore, Y-interference between opposite cells having tilted hemi-cylindrical vertical channel structures in stacks of conductive strips across an isolation block can be reduced, because the distance between the opposite cells in a tilted layout design is longer than that in an orthogonal layout design.

The memory device comprises a second stack of conductive strips, the conductive strips in the second stack extending in the first direction. An isolation block (e.g. insulation divider) separates the first-mentioned stack of conductive strips and the second stack of conductive strips. First hemi-cylindrical vertical channel structures in the first-mentioned stack of conductive strips are in contact with a first side of the isolation block. Second hemi-cylindrical vertical channel structures in the second stack of conductive strips are in contact with a second side of the isolation block opposite the first side of the isolation block. The first hemi-cylindrical vertical channel structures are disposed opposite the second hemi-cylindrical vertical channel structures across the isolation block along the major axis.

The first and second hemi-cylindrical vertical channel structures disposed along the major axis have a length along the major axis and a width orthogonal to the length, and a ratio of the length to the width has a range from 3 to 5.

The memory device can comprise a horizontal semiconductor film disposed beneath and connected to the semiconductor films in the first and second hemi-cylindrical vertical channel structures, wherein the horizontal semiconductor film has an elliptical shape having the major axis tilted relative to the first direction.

The memory device can comprise semiconductor films beneath the isolation block connected to the semiconductor films in the first and second hemi-cylindrical vertical channel structures to form a current path between the first and second hemi-cylindrical vertical channel structures.

The stack of conductive strips can include hemi-cylindrical vertical channel structures on a first side of the stack of conductive strips and on a second side of the stack of conductive strips opposite the first side. A common source line can be disposed above the stack of conductive strips, and connected to the hemi-cylindrical vertical channel structures on the first and second sides of the stack of conductive strips.

The memory device can comprise a plurality of stacks of conductive strips including the first-mentioned stack of conductive strips. A first odd stack in the plurality of stacks is disposed on a first side of an even stack in the plurality of stacks. A second odd stack in the plurality of stacks is disposed on a second side of the even stack opposite the first side.

A first set of bit lines is connected to the hemi-cylindrical vertical channel structures on a second side of the first odd stack adjacent the first side of the even stack. A second set of bit lines is connected to the hemi-cylindrical vertical channel structures on a first side of the second odd stack adjacent the second side of the even stack. Bit lines in the first set of bit lines alternate with bit lines in the second set of bit lines in the first direction.

The memory device can comprise a plurality of stacks of conductive strips separated by insulating strips, including the first-mentioned stack of conductive strips. The memory device can comprise a plurality of isolation blocks separating adjacent stacks in the plurality of stacks of conductive strips, including a first isolation block, a last isolation block, and intermediate isolation blocks arranged between the first and last isolation blocks in a second direction orthogonal to the first direction. The first and last isolation blocks have a first width, and the intermediate isolation blocks have a second width, wherein the first width is greater than the second width.

A method is also provided for manufacturing a memory device as described herein. The method includes forming a plurality of conductive layers separated by insulating layers. The method includes etching a plurality of rows of elliptical holes in the plurality of conductive layers, the rows of elliptical holes arranged in a first direction, each of the elliptical holes in the rows having a major axis tilted relative to the first direction. The method includes depositing data storage structures and semiconductor films on sidewalls and bottom surfaces of the elliptical holes in the rows. The method includes etching a plurality of slits through the conductive layers across the elliptical holes in respective rows of elliptical holes in the first direction, thereby forming a plurality of stacks of conductive strips and a plurality of hemi-cylindrical vertical channel structures extending through the conductive strips in the stacks, each of the hemi-cylindrical vertical channel structures having a divided elliptical cross section with a major axis tilted relative to the first direction. The major axis can be tilted at an angle relative to the first direction, the angle having a range between 30 degrees and 80 degrees.

The plurality of conductive layers can include a bottom conductive layer (IG), a top conductive layer (SSL/GSL), and a plurality of intermediate conductive layers (WLs) between the top conductive layer and the bottom layer. Said etching the plurality of rows of elliptical holes can stop at a hole etch level in the bottom conductive layer. Said etching the plurality of slits can stop at a slit etch level in the bottom conductive layer. The slit etch level is below the plurality of intermediate conductive layers and above a horizontal semiconductor film disposed over a horizontal layer of data storage structures on the bottom surfaces of the elliptical holes in the rows, and the hole etch level is below the horizontal layer of data storage structures.

The method can include filling the elliptical holes in the rows with an insulating material, and etching back the insulating material in the elliptical holes in the rows, to form a recess over a top surface of the insulating material in the elliptical holes in the rows, the top surface being higher than a top conductive layer in the plurality of conductive layers. The method can include depositing a conductive material in the recess and over top surfaces of the data storage structures and the semiconductor films, and removing the conductive material above the top surfaces of the data storage structures and the semiconductor films, while leaving the conductive material over the top surface of the insulating material in the elliptical holes in the rows.

Said etching the plurality of slits can include etching the conductive material over the top surface of the insulating material in the elliptical holes in the rows to form first and second plugs over the top surface of the insulating material in the elliptical holes in the rows, the first and second plugs connected to first and second vertical semiconductor films respectively in the elliptical holes in the rows.

The method can include forming a common source line connected to the first plug and the top surface of the first vertical semiconductor film, and a bit line contact connected to the second plug and the top surface of the second vertical semiconductor film, forming a via connected to the bit line contact, and forming a bit line connected to the via.

The method can include forming a plurality of isolation blocks in respective slits in the plurality of slits, where a particular isolation block in the plurality of isolation blocks separates a first stack of conductive strips and a second stack of conductive strips in the plurality of stacks of conductive strips, first hemi-cylindrical vertical channel structures in the first stack of conductive strips in contact with a first side of the particular isolation block, second hemi-cylindrical vertical channel structures in the second stack of conductive strips in contact with a second side of the particular isolation block opposite the first side of the particular isolation block.

The plurality of stacks of conductive strips can include an even stack of conductive strips, a first odd stack of conductive strips disposed on a first side of the even stack, and a second odd stack of conductive strips disposed on a second side of the even stack opposite the first side, and the plurality of hemi-cylindrical vertical channel structures includes hemi-cylindrical vertical channel structures on the first and second sides of the even stack of conductive strips. The method can include forming a common source line disposed above the even stack of conductive strips, and connected to the hemi-cylindrical vertical channel structures on the first and second sides of the even stack of conductive strips. The common source line extends in the first direction.

The method can include forming a first set of bit lines connected to the hemi-cylindrical vertical channel structures on a second side of the first odd stack adjacent the first side of the even stack, and a second set of bit lines connected to the hemi-cylindrical vertical channel structures on a first side of the second odd stack adjacent the second side of the even stack, bit lines in the first set of bit lines alternating with bit lines in the second set of bit lines in the first direction.

Other aspects and advantages of the present invention can be seen on review of the drawings, the detailed description and the claims, which follow.

BRIEF DESCRIPTION OF THE DRAWINGS

FIG. 2 illustrates a horizontal cross-section of an example 3D memory device taken at a conductive strip level.

FIG. 2A illustrates a first hemi-cylindrical vertical channel structure, and a second hemi-cylindrical vertical channel structure disposed opposite the first hemi-cylindrical vertical channel structure across an isolation block along a major axis tilted relative to a first direction.

FIGS. 2B and 2C illustrate a gate width for a tilted hemi-cylindrical vertical channel structure.

FIG. 3A illustrates a vertical cross-section of the first and second hemi-cylindrical vertical channel structures taken along the major axis as shown in FIG. 2A.

FIG. 3B illustrates a vertical cross-section of an isolation block separating the first and second hemi-cylindrical vertical channel structures taken along the line E-E' as shown in FIG. 2A.

FIG. 6 illustrates a block of memory cells comprising a plurality of stacks of conductive strips.

FIGS. 6A and 6B illustrate a wider width for first and last isolation blocks than intermediate isolation blocks in a plurality of isolation blocks in a block of memory cells.

FIGS. 7-18, 7A-16A and 14B illustrate stages of a manufacturing process for a memory device including hemi-cylindrical vertical channel structures.

FIG. 19 is an example layout view of an array of cells including hemi-cylindrical vertical channel structures in a first embodiment.

FIG. 19A illustrates the length L and the width W of the hemi-cylindrical vertical channel structures in the first embodiment as shown in FIG. 19.

DETAILED DESCRIPTION

The following description will typically be with reference to specific structural embodiments and methods. It is to be understood that there is no intention to limit the technology to the specifically disclosed embodiments and methods but that the technology may be practiced using other features, elements, methods and embodiments. Preferred embodiments are described to illustrate the present technology, not to limit its scope, which is defined by the claims. Those of ordinary skill in the art will recognize a variety of equivalent variations on the description that follows.

Figure 1:
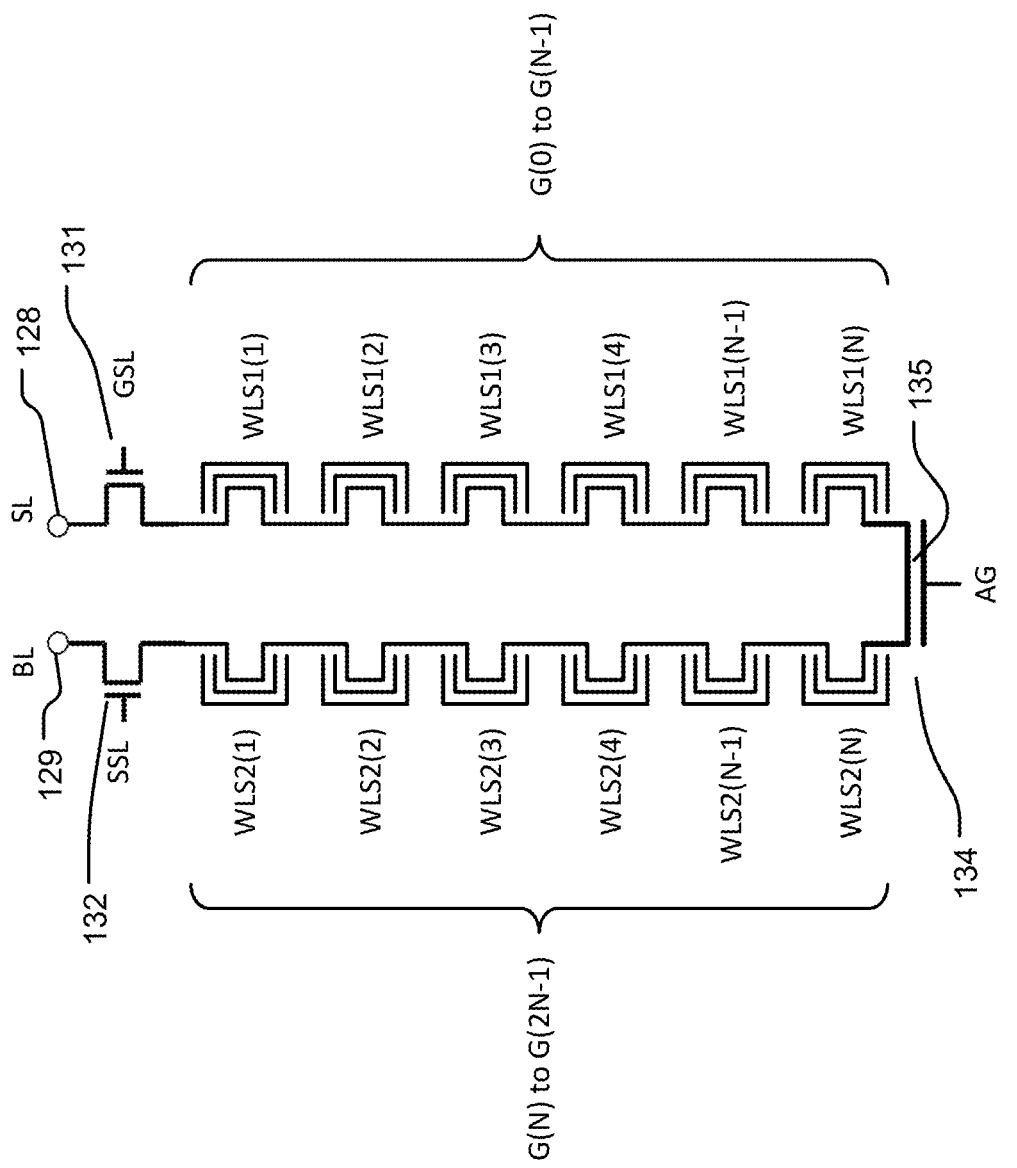
FIG. 1 illustrates a circuit schematic for a U-shaped NAND string.

FIG. 1 illustrates a circuit schematic for a U-shaped NAND string. The U-shaped NAND string is a series of flash memory cells connected between a string select switch 132 (sometimes called a drains side switch) connected to a bit line contact 129 and ground select switch 131 (sometimes called a source side switch) connected to a common source line contact 128. The U-shaped NAND string is disposed vertically in 3D structures, and has two stacks of cells on the channel lines on the two sides, designated first and second stacks in this description. An upper level in the first stack in this example includes a ground select line GSL which acts as a gate for a first switch 131 in the NAND string, and an upper level in the second stack includes a string select line SSL which acts as a gate for a second switch 132 in the same NAND string. Intermediate levels in the stack include word lines, where the word lines in the first stack include word line WLS1(1) to word line WLS1(N), where the index 1 to N represents the relative physical level in the stack of the word lines, and the word lines in the second stack include word line WLS2(1) to word line WLS2(N). At the bottom 134 of the U-shaped NAND string, the channel lines (also called local bit lines) are electrically connected, such as being formed by a single continuous film. Although it may be omitted in some embodiments, an assist gate structure 135 is included in the illustrated embodiment which is coupled by a gate dielectric to the channel line in the bottom of the stack. The assist gate structure 135 can be used to induce an inversion region that improves the conductivity of the channel line between the first and second sides. The word lines in NAND strings act as tri-gates or finFET-like double-gates for the memory cells in the string, and are typically numbered by an index going from 0 to one less than the number of cells in the string. In this case, the U-shaped string has 2N cells where N is the number of levels, and the word lines can be labeled G(0) to G(2N−1). The word lines on the first side include tri-gates or finFET-like double-gates G(0) to G(N−1). The word lines on the second side include tri-gates or finFET-like double-gates G(N) to G(2N−1).

FIG. 2 illustrates a horizontal cross-section of an example 3D memory device taken at a conductive strip level. The 3D memory device comprises stacks of conductive strips separated by insulating strips, the conductive strips in the stacks extending in a first direction (X-direction). As illustrated, a plurality of hemi-cylindrical vertical channel structures (141, 142, 143, 151, 152, 153) extends vertically through stacks of conductive strips (110, 120, 130), in a direction perpendicular to the X-Y plane. Each of the hemi-cylindrical vertical channel structures has a major axis 150 tilted relative to the first direction. The major axis 150 is shown as along a line A-A'.

The major axis 150 is tilted at an angle α relative to the first direction (X-direction), corresponding to an angle θ relative to the second direction (Y-direction) which is orthogonal to the first direction. The angle α and the angle θ are complementary to each other, i.e., α=90°−θ and θ=90°−α. In one embodiment, the angle θ can have a range between 10° and 60°, and correspondingly, the angle α can have a range between 30° and 80°.

An isolation block (e.g. 161) provides an insulation divider to separate a first stack of conductive strips (e.g. 110) and a second stack of conductive strips (e.g. 120) adjacent the first stack. Another isolation block (e.g. 162) can separate the second stack of conductive strips and a third stack of conductive strips (e.g. 130) adjacent the second stack.

First hemi-cylindrical vertical channel structures (e.g. 141, 142, 143) in the first stack of conductive strips 110 are in contact with a first side 161a of the isolation block 161. Second hemi-cylindrical vertical channel structures (e.g. 151, 152, 153) in the second stack of conductive strips 120 are in contact with a second side 161b of the isolation block 161 opposite the first side 161a of the isolation block 161. The first hemi-cylindrical vertical channel structures are disposed opposite the second hemi-cylindrical vertical channel structures across the isolation block 161 along the major axis 150.

FIG. 2A illustrates a first hemi-cylindrical vertical channel structure 143, and a second hemi-cylindrical vertical channel structure 153 disposed opposite the first hemi-cylindrical vertical channel structure across an isolation block 161 along a major axis 150 tilted relative to a first direction. As illustrated in FIG. 2A, data storage structures (143a, 153a) are disposed on the sidewalls of the conductive strips (110, 120). The hemi-cylindrical vertical channel structures comprise semiconductor films (143b, 153b) having outside surfaces in contact with the data storage structures on the sidewalls of the conductive strips. Insulating material (143c, 153c) can fill volumes surrounded by the inside surfaces of the semiconductor films (143b, 153b) and the isolation block 161.

The conductive strips in the stack of conductive strips (110, 120) can act as tri-gates or finFET-like double-gates in contact with the hemi-cylindrical vertical channel structures (143, 153).

The first and second hemi-cylindrical vertical channel structures (e.g. 143, 153) disposed along the major axis 150 have a length L along the major axis 150 and a width W orthogonal to the length L. In one embodiment, a ratio of the length L to the width W can have a range from 3 to 5.

FIGS. 2B and 2C illustrate a gate width for a tilted hemi-cylindrical vertical channel structure. First, a perimeter P is calculated for a cylindrical vertical channel structure having a horizontal cross-section in an example ellipse-like shape, before the cylindrical vertical channel structure is divided into first and second hemi-cylindrical vertical channel structures (e.g. 143, 153, FIGS. 2, 2A) by an isolation block (e.g. 161). The second hemi-cylindrical vertical channel structure 153 is disposed opposite the first hemi-cylindrical vertical channel structure 143 across the isolation block 161 along the major axis 150. Second, the perimeter P is divided by 2 to obtain a gate width for a single hemi-cylindrical vertical channel structure.

Calculation of a gate width using the example ellipse-like shape is provided for the purpose of illustrating that the gate width for the hemi-cylindrical vertical channel structures as described herein is greater than a gate width of a single gate and flat channel structure, but not to limit the horizontal cross-section of the hemi-cylindrical vertical channel structures as described herein to the example ellipse-like shape. A greater gate width can result in better gate controllability.

As shown in FIG. 2, Fy is a height in the second direction (Y-direction) of a first hemi-cylindrical vertical channel structure (e.g. 143) and a second hemi-cylindrical vertical channel structure (e.g. 153) disposed opposite the first hemi-cylindrical vertical channel structure across an isolation block (e.g. 161) along the major axis 150. As shown in FIG. 2, Fx is a measurement in the first direction (X-direction) across a hemi-cylindrical vertical channel structure (e.g. 141). Fx can correspond to a gate width in a single gate and flat channel structure.

As shown in FIG. 2B, the length L and the width W of the example ellipse-like shape can be approximated as a function of Fy, Fx and the angle θ, such that $L \approx Fy/\cos\theta$ $W \approx Fx * \cos\theta$ The example ellipse-like shape includes a first semicircle and a second semicircle having a radius R at opposite ends of the example ellipse-like shape along the major axis 150. The width W is approximately twice the radius R (W=2R), and the two semicircles have a combined circumference C=2πR. As shown in FIGS. 2A and 2B, the perimeter P of a cylindrical vertical channel structure having a horizontal cross-section in the example ellipse-like shape can be approximated as $$P \approx C + 2*(L - 2R)$$
$$\approx 2\pi R + 2*(L - W)$$
$$\approx \pi W + 2*(L - W)$$
$$\approx (\pi - 2)*W + 2*L$$
$$\approx 1.14*W + 2*L$$
$$\approx 1.14*Fx*\cos\theta + 2*Fy/\cos\theta$$

FIG. 2C illustrates a gate width Wg for tri-gates in contact with hemi-cylindrical vertical channel structures having a tilted major axis. Dividing the perimeter P of a cylindrical vertical channel structure by 2, a gate width Wg of a hemi-cylindrical vertical channel structure can be approximated as:

$$Wg \approx 0.57*W + L$$
$$\approx 0.57*Fx*\cos\theta + Fy/(\cos\theta)$$

In one embodiment, a ratio of the length L to the width W (L/W) can have a range from 3 to 5, and the angle θ can have a range between 10° and 60°. For instance, using a lower limit of 3 in the L/W range and a lower limit of 10° in the angle θ range, L/W=3, L=3 W, θ=10°, then Wg≈3.5 Fx which is greater than Fx. For instance, using a lower limit of 3 in the L/W range and an upper limit of 60° in the angle θ range, L/W=3, L=3 W, θ=60°, then Wg≈1.78 Fx which is greater than Fx.

A length L2 of a hemi-cylindrical vertical channel structure is about half the length L of the example ellipse-like shape, i.e., L2=L/2. In the embodiment where a ratio of the length L to the width W (L/W) can have a range from 3 to 5, a ratio of the length L2 to the width W can have a range from 1.5 to 2.5.

Figure 2D:
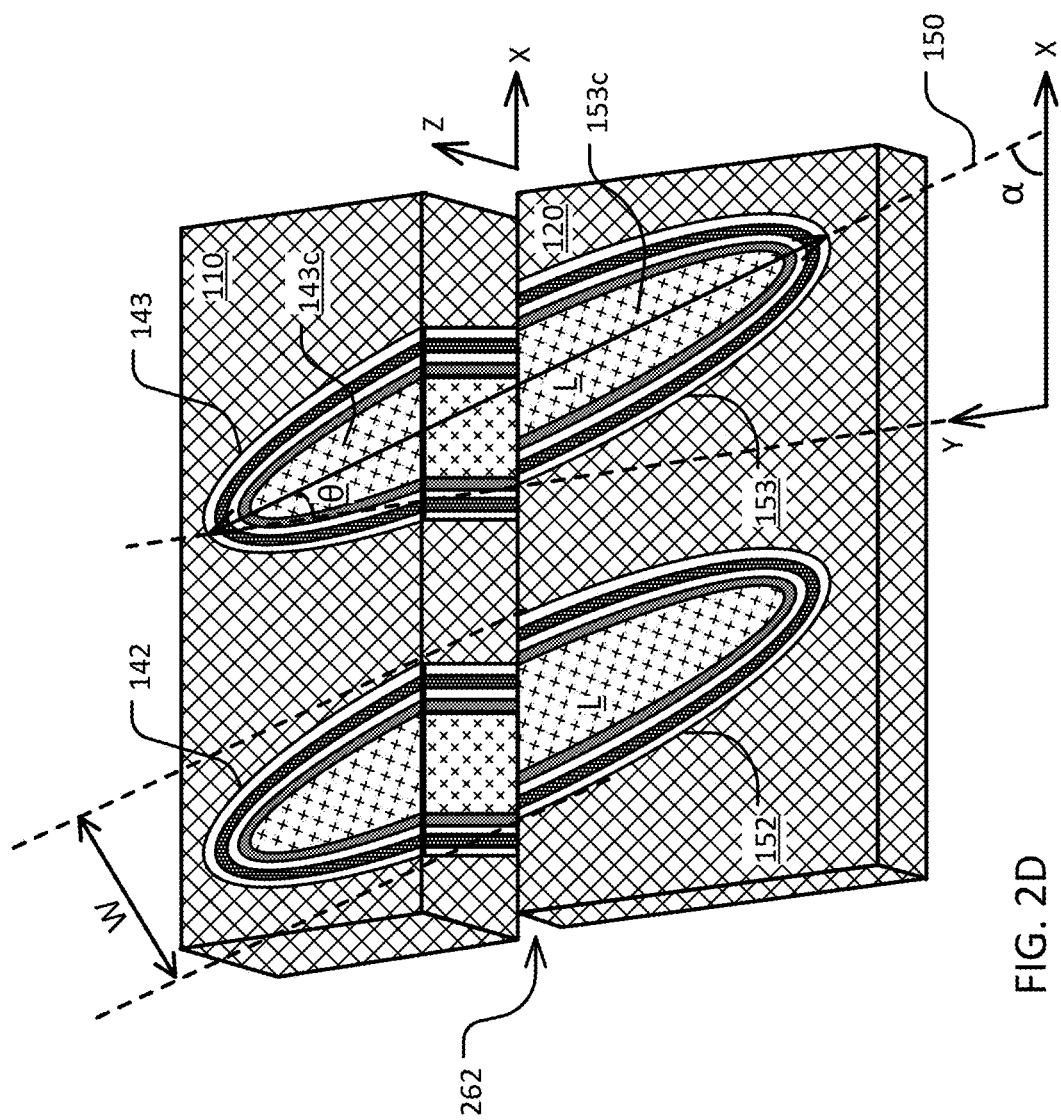
FIG. 2D illustrates a perspective view of example hemi-cylindrical vertical channel structures.

FIG. 2D illustrates a perspective view of example hemi-cylindrical vertical channel structures. Like elements in FIGS. 2, 2A, 2B, 2C and 2D are referred to with like reference numerals. As illustrated, a plurality of hemi-cylindrical vertical channel structures (142, 143, 152, 153) extends vertically through stacks of conductive strips (110, 120), in a direction Z perpendicular to the X-Y plane. Each of the hemi-cylindrical vertical channel structures has a major axis 150 tilted relative to the first direction (X-direction). The conductive strips in the stacks of conductive strips can act as tri-gates or finFET-like double-gates in contact with the hemi-cylindrical vertical channel structures.

The major axis 150 is tilted at an angle α relative to the first direction (X-direction), corresponding to an angle θ relative to the second direction (Y-direction) which is orthogonal to the first direction. The angle α and the angle θ are complementary to each other, and are further described in reference to FIG. 2.

First and second hemi-cylindrical vertical channel structures (e.g. 143, 153) disposed opposite each other across a slit 262 along the major axis 150 have a length L along the major axis 150 and a width W orthogonal to the length L. In one embodiment, a ratio of the length L to the width W can have a range from 3 to 5. An isolation structure (e.g. 161, FIG. 2A) can be formed in the slit.

FIG. 3A illustrates a vertical cross-section of the first and second hemi-cylindrical vertical channel structures taken along the line A-A' as shown in FIG. 2A. The first and second stacks of conductive strips 110 and 120 can include at least a bottom plane of conductive strips acting as inversion gates (IG), a top plane of conductive strips acting as string select lines (SSL) or ground select line (GSL), and a plurality of intermediate planes (WL) of conductive strips acting as word lines between the top plane and the bottom plane. The plurality of intermediate planes can include N planes, ranging from 1 to N for the stacks. For instance, N=32. The inversion gates (IGs) can generate an inversion layer to reduce cell current when the inversion gates have a bias greater than the threshold voltage of the memory cells in the memory array. The stacks 110 and 120 include layers of insulating material 311, 312, 313, 314 and 315, separating the conductive strips from one another. A top layer 320 of silicon nitride is disposed on each stack.

The conductive strips acting as word lines (WL), string select lines (SSL) and ground select lines (GSL) can comprise a variety of materials including doped semiconductors, metals, and conductive compounds, including materials comprising Si, Ge, SiGe, SiC, TiN, TaN, W, and Pt.

Data storage structures (e.g. 143a, 153a) are disposed on the sidewalls of the conductive strips in the first stack of conductive strips 110. Semiconductor films 143b have outside surfaces in contact with the data storage structures 143a on the sidewalls of the conductive strips in the first stack of conductive strips 110. Data storage structures 153a are disposed on the sidewalls of the conductive strips in the second stack of conductive strips 120. Semiconductor films 153b have outside surfaces in contact with the data storage structures 153a on the sidewalls of the conductive strips in the second stack of conductive strips 120. Insulating material (143c, 153c) can fill volumes surrounded by the inside surfaces of the semiconductor films (143b, 153b) and the isolation block 161.

The semiconductor films (e.g. 143b, 153b) can comprise semiconductor materials adapted to act as channels for the memory cells, such materials as Si, Ge, SiGe, GaAs, SiC, and graphene.

The data storage structures (e.g. 143a, 153a) can include a multilayer data storage structure, known from flash memory technologies, including for example flash memory technologies known as ONO (oxide-nitride-oxide), ONONO (oxide-nitride-oxide-nitride-oxide), SONOS (silicon-oxide-nitride-oxide-silicon), BE-SONOS (bandgap engineered silicon-oxide-nitride-oxide-silicon), TANOS (tantalum nitride, aluminum oxide, silicon nitride, silicon oxide, silicon), and MA BE-SONOS (metal-high-k bandgap-engineered silicon-oxide-nitride-oxide-silicon).

A horizontal semiconductor film 370 is disposed beneath and connected to the semiconductor films 143b and 153b in the first and second hemi-cylindrical vertical channel structures 143 and 153. The horizontal semiconductor film 370 can have an elliptical shape having the major axis tilted relative to the first direction, as further described in reference to FIG. 4. The horizontal semiconductor film 370 can act as channel for an assist gate structure (e.g. 135, FIG. 1).

A horizontal layer of data storage structures 360 is disposed beneath the horizontal semiconductor film 370 and connected to the data storage structures 143a and 153a in the first and second hemi-cylindrical vertical channel structures 143 and 153. The horizontal layer of data storage structures 360 can have an elliptical shape having the major axis tilted relative to the first direction, as further described in reference to FIG. 4. The horizontal layer of data storage structures 360 can act as gate dielectric for an assist gate structure (e.g. 135, FIG. 1).

Figure 4:
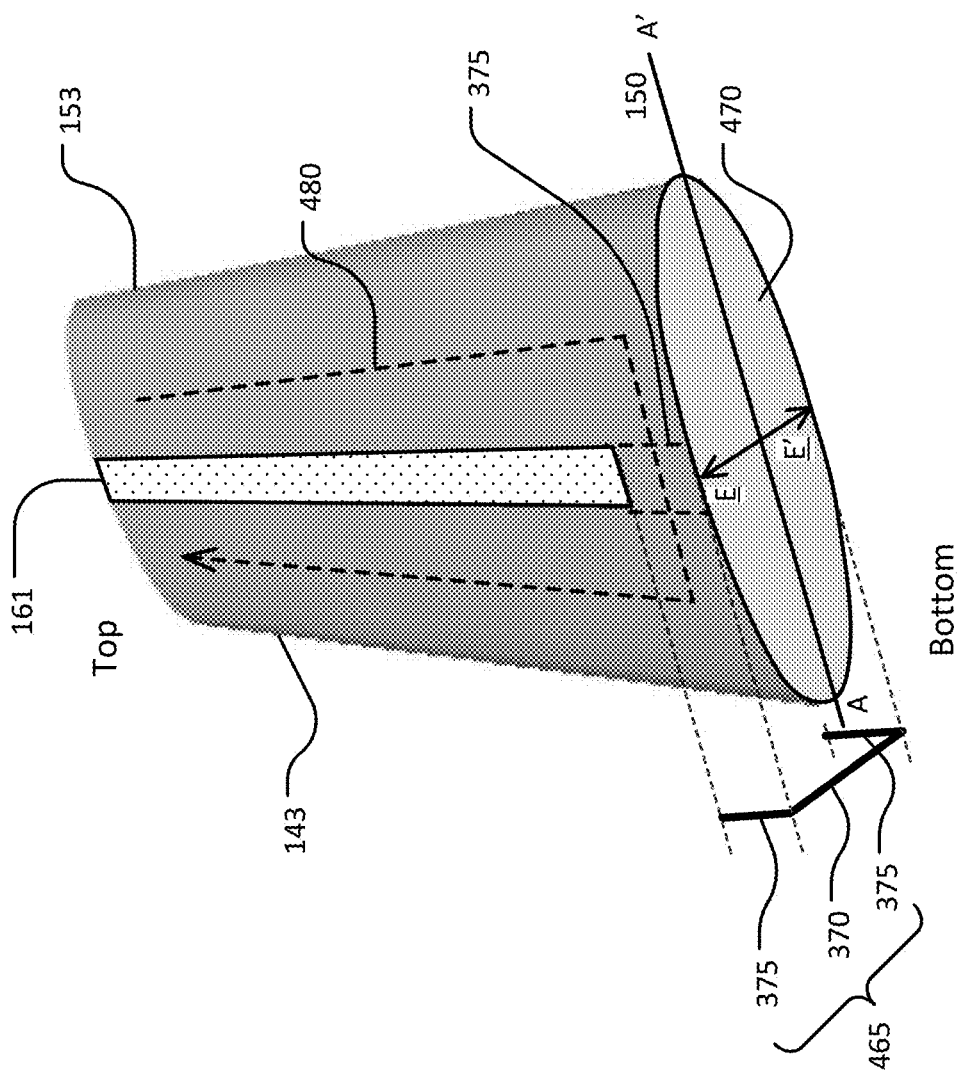
FIG. 4 illustrates a perspective view of the first and second hemi-cylindrical vertical channel structures as shown in FIGS. 2A, 3A and 3B.

FIG. 3B illustrates a vertical cross-section of an isolation block 161 separating the first and second hemi-cylindrical vertical channel structures taken along the line E-E' as shown in FIG. 2A. Semiconductor films 375 are disposed beneath the isolation block 161 and connected to the semiconductor films 143b and 153b in the first and second hemi-cylindrical vertical channel structures 143 and 153 (FIGS. 3 and 4). Semiconductor films 375 have a first top surface 375s higher than a second top surface 370s of the horizontal semiconductor film 370.

Vertical layers of data storage structures 365 are disposed beneath the isolation block 161 and connected to the data storage structures 143a and 153a in the first and second hemi-cylindrical vertical channel structures 143 and 153 (FIGS. 3 and 4).

A current path can be formed between the first and second hemi-cylindrical vertical channel structures 143 and 153 through semiconductor films 375, as further described in reference to FIG. 4.

FIG. 4 illustrates a perspective view of the first and second hemi-cylindrical vertical channel structures as shown in FIGS. 2A, 3A and 3B. An isolation block 161 separates the first and second hemi-cylindrical vertical channel structures 143 and 153.

The first and second hemi-cylindrical vertical channel structures 143 and 153 at the bottom can have an elliptical shape 470 having the major axis 150 tilted relative to the first direction (FIG. 2A). A horizontal semiconductor film 370 disposed beneath and connected to the semiconductor films 143b and 153b, as shown in FIG. 3A, can have the elliptical shape 470. Similarly, a horizontal layer of data storage structures 360 disposed beneath the horizontal semiconductor film 370 and connected to the data storage structures 143a and 153a, as shown in FIG. 3A, can have the elliptical shape 470.

A U-shaped current path 480 can be formed between the first and second hemi-cylindrical vertical channel structures 143 and 153 through semiconductor films 375, where the semiconductor films 375 are disposed beneath the isolation block 161 and connected to the semiconductor films (143b, 153b, FIGS. 2A, 3A) in the first and second hemi-cylindrical vertical channel structures 143 and 153. Semiconductor films 375 and a horizontal semiconductor film 370 (FIG. 3B) can form a U-shaped film structure 465 beneath the isolation block 161 along the line E-E'.

One of the first and second hemi-cylindrical vertical channel structures can be connected to a bit line on top, while another of the first and second hemi-cylindrical vertical channel structures can be connected to a source line on top, so a current can flow between the bit line and the source line through the U-shaped current path. Connections to a common source line and bit lines are described in reference to FIG. 5.

Figure 5:
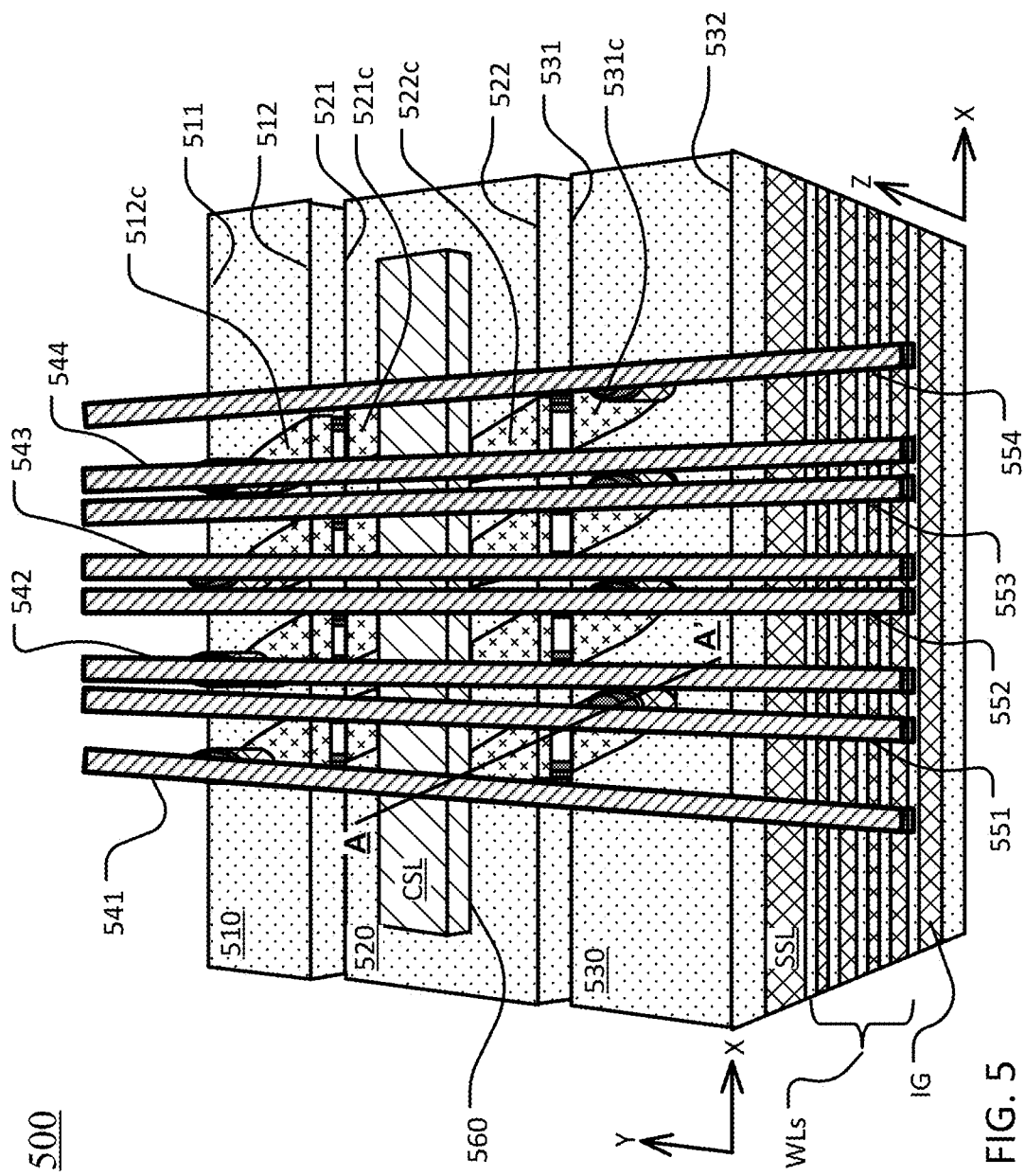
FIG. 5 illustrates an example perspective view of a memory device that comprises a common source line and bit lines above stacks of conductive strips.

FIG. 5 illustrates an example perspective view of a memory device that comprises a common source line CSL 560 disposed above a stack of conductive strips. A memory device 500 comprises a stack of conductive strips 520 separated by insulating strips, the conductive strips in the stack extending in a first direction (X-direction), and arranged vertically in a second direction (Y-direction) orthogonal to the first direction. A stack of conductive strips can include a bottom plane of conductive strips (IG), a top plane of conductive strips (SSL/GSL), and a plurality of intermediate planes (WLs), as described in reference to FIG. 3A.

The stack of conductive strips 520 includes hemi-cylindrical vertical channel structures 521c on a first side 521 of the stack of conductive strips 520, and hemi-cylindrical vertical channel structures 522c on a second side 522 of the stack of conductive strips 520 opposite the first side 521.

A common source line 560 is disposed above the stack of conductive strips 520, connected to the hemi-cylindrical vertical channel structures 521c on the first side 521 of the stack of conductive strips 520, and connected to the hemi-cylindrical vertical channel structures 522c on the second side 522 of the stack of conductive strips 520.

In the example shown in FIG. 5, the memory device 500 comprises a plurality of stacks of conductive strips (510, 520, 530). A first odd stack 510 in the plurality of stacks is disposed on a first side 521 of an even stack 520 in the plurality of stacks, a second odd stack 530 in the plurality of stacks is disposed on a second side 522 of the even stack 520 opposite the first side 521.

A first set of bit lines 541-544 is connected to the hemi-cylindrical vertical channel structures 512c on a second side 512 of the first odd stack 510 adjacent the first side 521 of the even stack 520. A second set of bit lines 551-554 is connected to the hemi-cylindrical vertical channel structures 531c on a first side 531 of the second odd stack 530 adjacent the second side 522 of the even stack 520. Bit lines in the first set of bit lines 541-544 alternate with bit lines in the second set of bit lines 551-554 in the first direction (X-direction).

FIG. 6 illustrates a block of memory cells comprising a plurality of stacks of conductive strips. A block of memory cells 600 comprises a plurality of stacks of conductive strips (610, 620, 630, 640, 650, 660), and a plurality of isolation blocks (615, 625, 635, 645, 655, 665) separating adjacent stacks in the plurality of stacks of conductive strips. A plurality of stacks of conductive strips can include even stacks of conductive strips (e.g. 620, 640, 660) alternating with odd stacks of conductive strips (e.g. 630, 650). Although only 2 odd stacks of conductive strips are shown, a block of memory cells can include N odd stacks of conductive strips where N is greater than 2. The top strip or strips in the even stacks of conductive strips can act as ground select lines (GSL) for connection to a common source line, and the top strip or strips in the odd stacks of conductive strips can act as string select lines (SSL) for connection to bit lines, as further described in reference to FIG. 5.

The plurality of isolation blocks includes a first isolation block 615, a last isolation block 665, and intermediate isolation blocks (625, 635, 645, 655) arranged between the first and last isolation blocks in the second direction (Y-direction). The hemi-cylindrical vertical channel structures (e.g. 624) extending through the stacks of conductive strips (e.g. 620) have a major axis 150 tilted relative to the first direction (X-direction).

FIGS. 6A and 6B illustrate a wider width for first and last isolation blocks than intermediate isolation blocks in a plurality of isolation blocks in a block of memory cells. FIG. 6A illustrates a vertical cross-section taken along a line D-D' across the first and last isolation blocks 615 and 665 as shown in FIG. 6. The line D-D' is tilted relative to the first direction like the major axis 150. The first and last isolation blocks 615 and 665 have a first width 691. FIG. 6B illustrates a vertical cross-section taken along a line B-B' across the intermediate blocks as shown in FIG. 6. The line B-B' is tilted relative to the first direction like the major axis 150. The intermediate isolation blocks have a second width 692. The first width 691 of the first and last isolation blocks is greater than the second width 692 of the intermediate isolation blocks.

As shown in FIGS. 6A and 6B, the stacks of conductive strips can include at least a bottom plane of conductive strips acting as inversion gates (IG), a top plane of conductive strips acting as string select lines (SSL/GSL), and a plurality of intermediate planes (WLs) of conductive strips acting as word lines between the top plane and the bottom plane. The plurality of intermediate planes can include N planes, ranging from 1 to N for the stacks. The inversion gates (IGs) can generate an inversion layer to reduce cell current when the inversion gates have a bias greater than the threshold voltage of the memory cells in the memory array.

A memory device can comprise multiple blocks of memory cells, and each of the blocks of memory cells can comprise a plurality of stacks of conductive strips as described in reference to FIGS. 6, 6A and 6B. The first width 691 of the first and last isolation blocks is greater than the second width 692 of the intermediate isolation blocks. At block-to-block boundaries, the first width 691 of the first and last isolation blocks is wide enough to allow deeper etching through the inversion gates (IGs), so that the inversion gates (IGs) can be completely isolated between the blocks of memory cells, as shown in FIG. 6A. In comparison, the second width 692 of the intermediate isolation blocks is not wide enough to allow deep enough etching to completely isolate the inversion gates (IGs), as shown in FIG. 6B.

Figure 7:
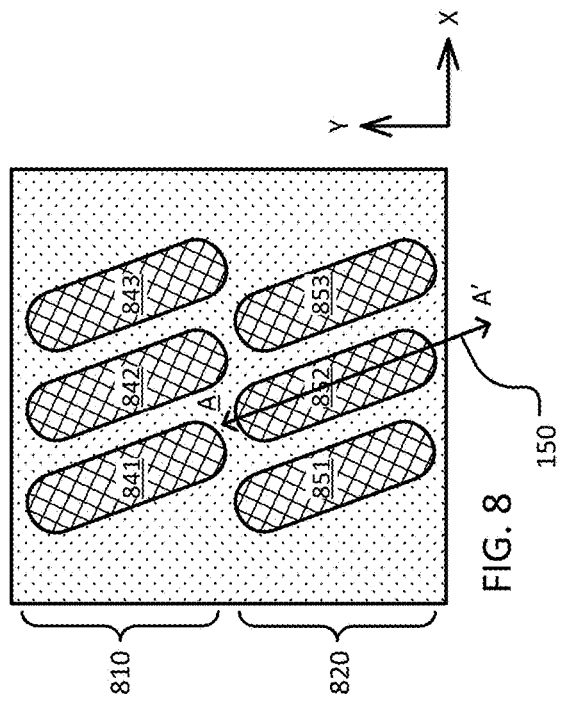
Figure 7A:
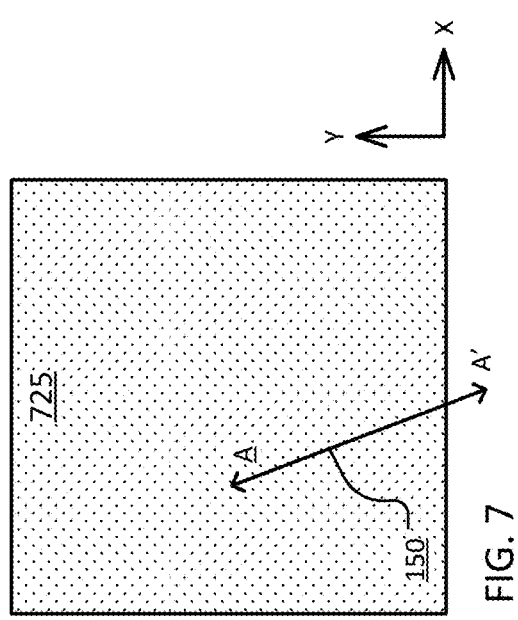

FIGS. 7-18, 7A-16A and 14B illustrate stages of a manufacturing process for a memory device including hemi-cylindrical vertical channel structures as illustrated in FIGS. 2, 2A, 2D, 3A, 3B, 4, 5, 6 and 6A-6B. FIGS. 7 and 7A illustrate a stage of the process flow after forming a plurality of conductive layers separated by insulating layers.

FIG. 7 illustrates a top insulating layer 725 over the plurality of conductive layers separated by insulating layers. FIG. 7A is a vertical cross-section of FIG. 7 taken along a line A-A' shown in FIG. 7, where the line A-A' is tilted relative to a first direction (X-direction). As shown in FIG. 7A, a plurality of conductive layers can include at least a bottom conductive layer that can act as an inversion layer (IG), a top conductive layer that can be etched to form string select lines (SSL) or ground select line (GSL), and a plurality of intermediate conductive layers between the top conductive layer and the bottom layer that can be etched to form word lines (WL). The plurality of intermediate conductive layers can include N layers, where N is greater than 2. For instance, N=32. The conductive layers can comprise a variety of materials including doped semiconductors, metals, and conductive compounds, including materials comprising Si, Ge, SiGe, SiC, TiN, TaN, W, and Pt.

Insulating layers 711, 712, 713, 714 and 715 separate the conductive layers. The insulating layers can comprise a silicon oxide or other dielectric on a semiconductor substrate. A top layer 720 of silicon nitride is disposed on a plurality of conductive layers, and the top insulating layer 725 is disposed on the top layer 720 of silicon nitride.

Figure 8:
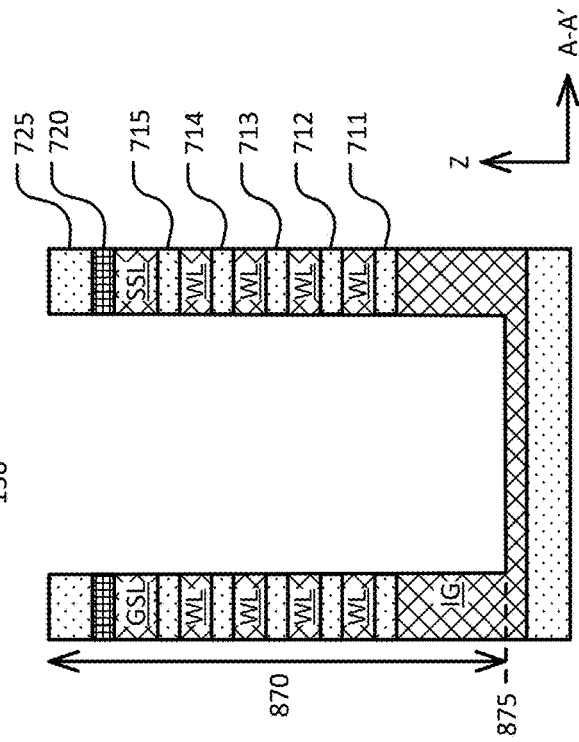
Figure 8A:
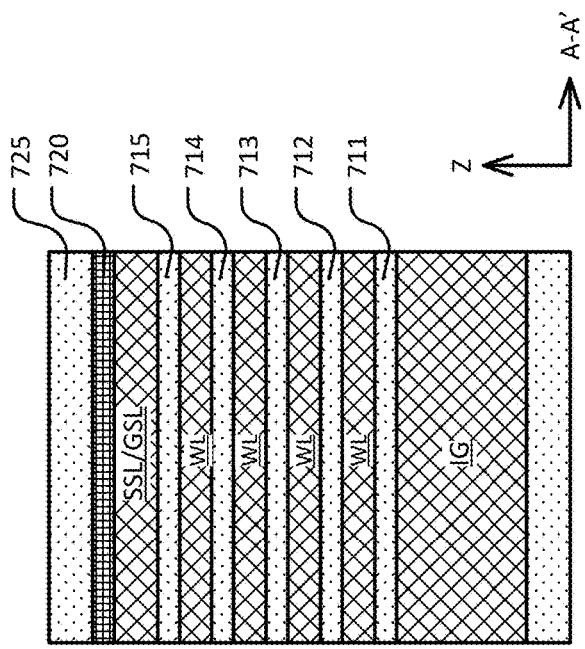

FIGS. 8 and 8A illustrate a stage of the process flow after etching a plurality of rows of elliptical holes in the plurality of conductive layers. FIG. 8A is a vertical cross-section of FIG. 8 taken along the line A-A' shown in FIG. 8. In the example of FIG. 8, a first row 810 of elliptical holes (841, 842, 843) and a second row 820 of elliptical holes (851, 852, 853) are arranged in the first direction (X-direction). Each of the elliptical holes in the rows in the plurality of rows of elliptical holes has a major axis 150 tilted relative to the first direction (X-direction). The major axis 150 is shown along the line A-A'.

The elliptical holes in the rows of elliptical holes are etched through the top insulating layer 725, the top layer 720 of silicon nitride, the top conductive layer (SSL/GSL), the plurality of intermediate conductive layers (WL), and partially through the bottom conductive layer (IG). The etching process to etch the elliptical holes stops at a hole etch level 875 in the bottom conductive layer (IG), and has a hole etch depth 870 from the top insulating layer 725 to the hole etch level 875 in the bottom conductive layer (IG).

Figure 9:
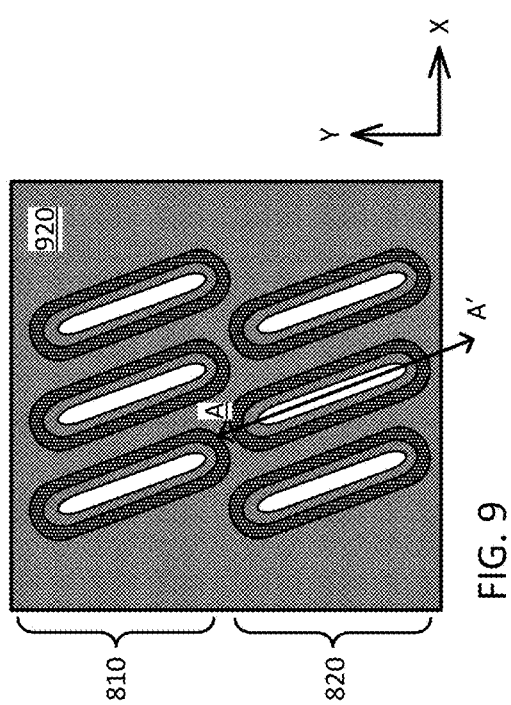
Figure 9A:
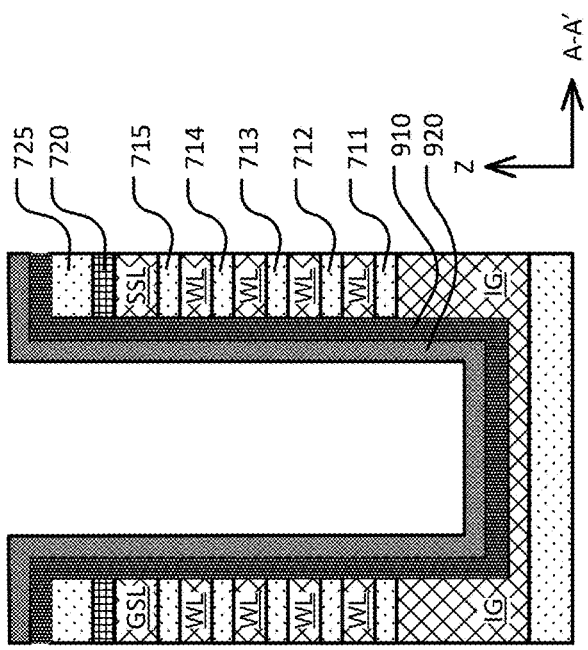

FIGS. 9 and 9A illustrate a stage of the process flow after depositing data storage structures and semiconductor films on sidewalls and bottom surfaces of the elliptical holes in the rows of elliptical holes. The semiconductor films can comprise semiconductor materials adapted to act as channels for the memory cells, such materials as Si, Ge, SiGe, GaAs, SiC, and graphene. The data storage structures are described in reference to FIG. 3A. FIG. 9A is a vertical cross-section of FIG. 9 taken along the line A-A' shown in FIG. 9.

Data storage structures 910 are deposited on sidewalls of the elliptical holes, over the bottom of the elliptical holes 875, and over the top insulating layer 725. A semiconductor film 920 is deposited over and in contact with the data storage structures 910.

Figure 10:
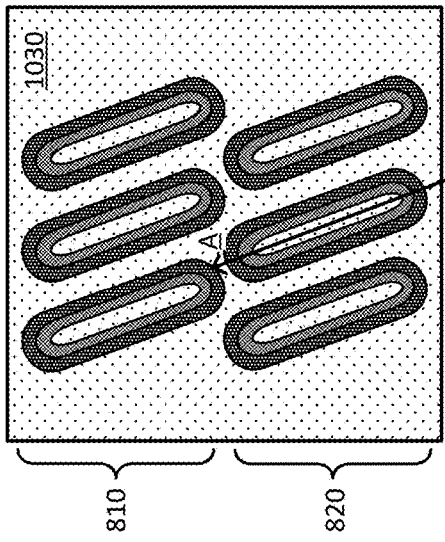
Figure 10A:
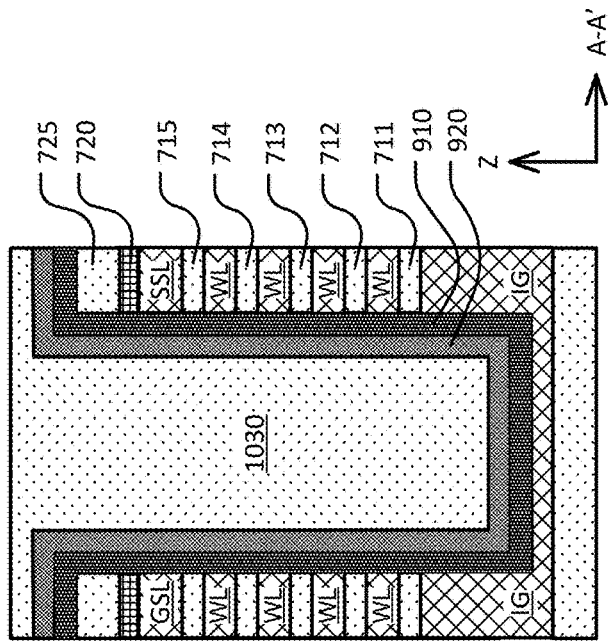

FIGS. 10 and 10A illustrate a stage of the process flow after filling the elliptical holes in the rows with an insulating material 1030. FIG. 10A illustrates a vertical cross-section of FIG. 10 taken along the line A-A' shown in FIG. 10. The insulating material 1030 is also deposited over the top surface of the semiconductor film 920.

Figure 11:
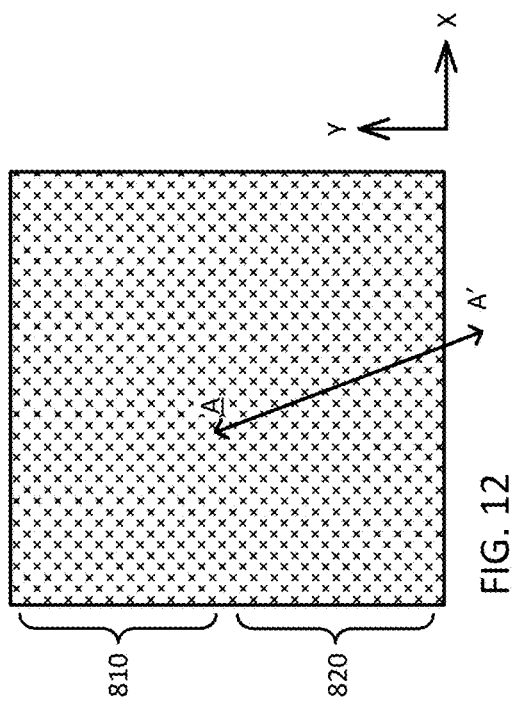
Figure 11A:
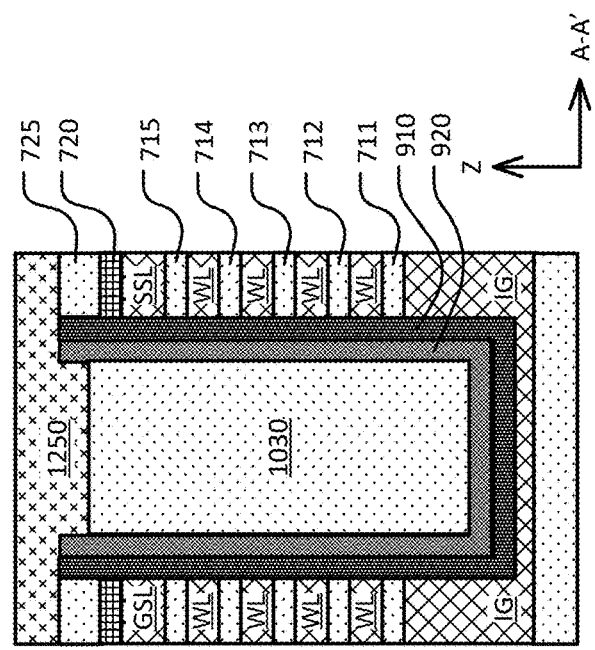

FIGS. 11 and 11A illustrate a stage of the process flow after etching back the insulating material 1030 in the elliptical holes in the rows, to form a recess 1140 over a top surface 1135 of the insulating material 1030 in the elliptical holes in the rows. The top surface 1135 can be higher than a top conductive layer (SSL/GSL) in the plurality of conductive layers. FIG. 11A illustrates a vertical cross-section of FIG. 11 taken along the line A-A' shown in FIG. 11.

Figure 12:
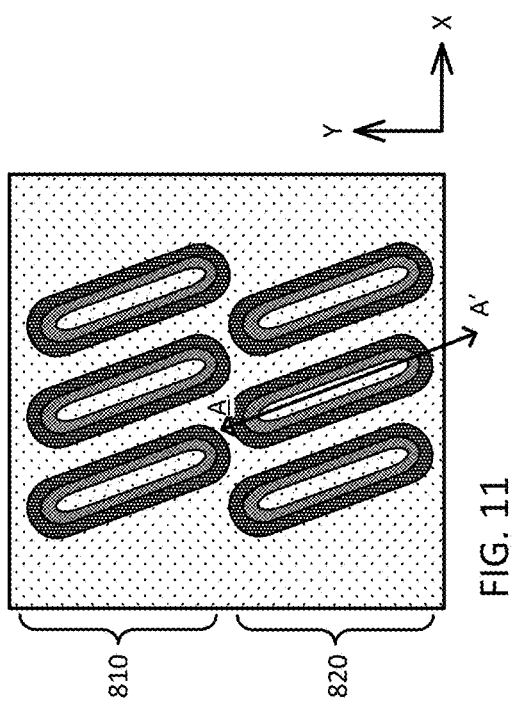
Figure 12A:
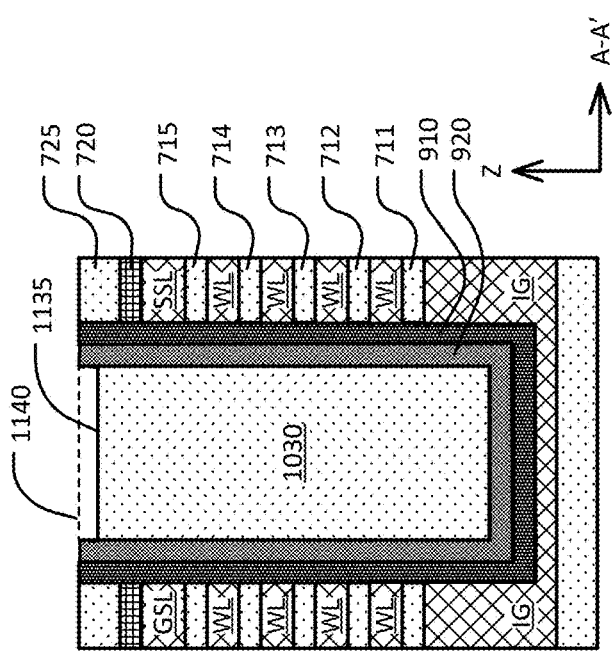

FIGS. 12 and 12A illustrate a stage of the process flow after depositing a conductive material 1250 in the recess 1140 and over top surfaces of the data storage structures 910 and the semiconductor film 920. For instance, the conductive material 1250 can include W (tungsten), and can be deposited by CVD (chemical vapor deposition). FIG. 12 illustrates a top view of the conductive material 1050. FIG. 12A illustrates a vertical cross-section of FIG. 12 taken along the line A-A' shown in FIG. 12.

FIGS. 13 and 13A illustrate a stage of the process flow after removing the conductive material above the top surfaces of the data storage structures 910 and the semiconductor film 920, for instance by CMP (chemical mechanical planarization), while leaving the conductive material 1250 over the top surface of the insulating material 1030 in the elliptical holes in the rows. FIG. 13 illustrates a top view of the conductive material 1050. FIG. 13A illustrates a vertical cross-section of FIG. 13 taken along the line A-A' shown in FIG. 13.

FIGS. 14 and 14A illustrate a stage of the process flow after etching a plurality of slits (1461, 1462) through the conductive layers (GSL, SSL, WLs) across the elliptical holes (e.g. 841, 842, 843, 851, 852, 853, FIG. 8) in respective rows (e.g. 810, 820) in the first direction (X-direction). FIG. 14A illustrates a vertical cross-section of FIG. 14 taken along the line A-A' shown in FIG. 14.

The slits in the plurality of slits are etched through the top insulating layer 725, the top layer 720 of silicon nitride, the top conductive layer (SSL/GSL), the plurality of intermediate conductive layers (WL), and partially through the bottom conductive layer (IG). The etching process to etch the slits stops at a slit etch level 1475 in the bottom conductive layer (IG), and has a slit etch depth 1470 from the top insulating layer 725 to the slit etch level 1475 in the bottom conductive layer (IG). The slit etch level 1475 is below the plurality of intermediate conductive layers (WL) and above a horizontal semiconductor film 923 disposed over a horizontal layer of data storage structures 913 in the elliptical holes in the rows, and the hole etch level 875 (FIG. 8A) is below the horizontal layer of data storage structures 913.

This etching stage can result in forming a plurality of stacks of conductive strips (110, 120, 130) and a plurality of hemi-cylindrical vertical channel structures (1441, 1442, 1443, 1451, 1452, 1453) extending through the conductive strips in the stacks. Each of the hemi-cylindrical vertical channel structures has a major axis 150 tilted relative to the first direction (X-direction).

This etching stage can include etching the data storage structures 910 into first and second data storage structures 911 and 912 on side walls of adjacent and opposite stacks of conductive strips (120, 130). A horizontal layer of data storage structures 913 over the bottom of the elliptical holes is connected to the first and second data storage structures 911 and 912.

This etching stage can include etching the semiconductor film 920 into first and second vertical semiconductor film 921 and 922 on side walls of the adjacent and opposite stacks of conductive strips (120, 130). A horizontal semiconductor film 923 over the bottom of the elliptical holes is connected to the first and second vertical semiconductor film 921 and 922, over the horizontal layer of data storage structures 913.

This etching stage can include etching the conductive material 1250 over the top surface of the insulating material 1030 in the elliptical holes in the rows to form first and second plugs (1251, 1252) over the top surface of the insulating material 1030 in the elliptical holes in the rows, where the first and second plugs are connected to the first and second semiconductor films (921, 922) respectively in the elliptical holes in the rows.

Figure 14B:
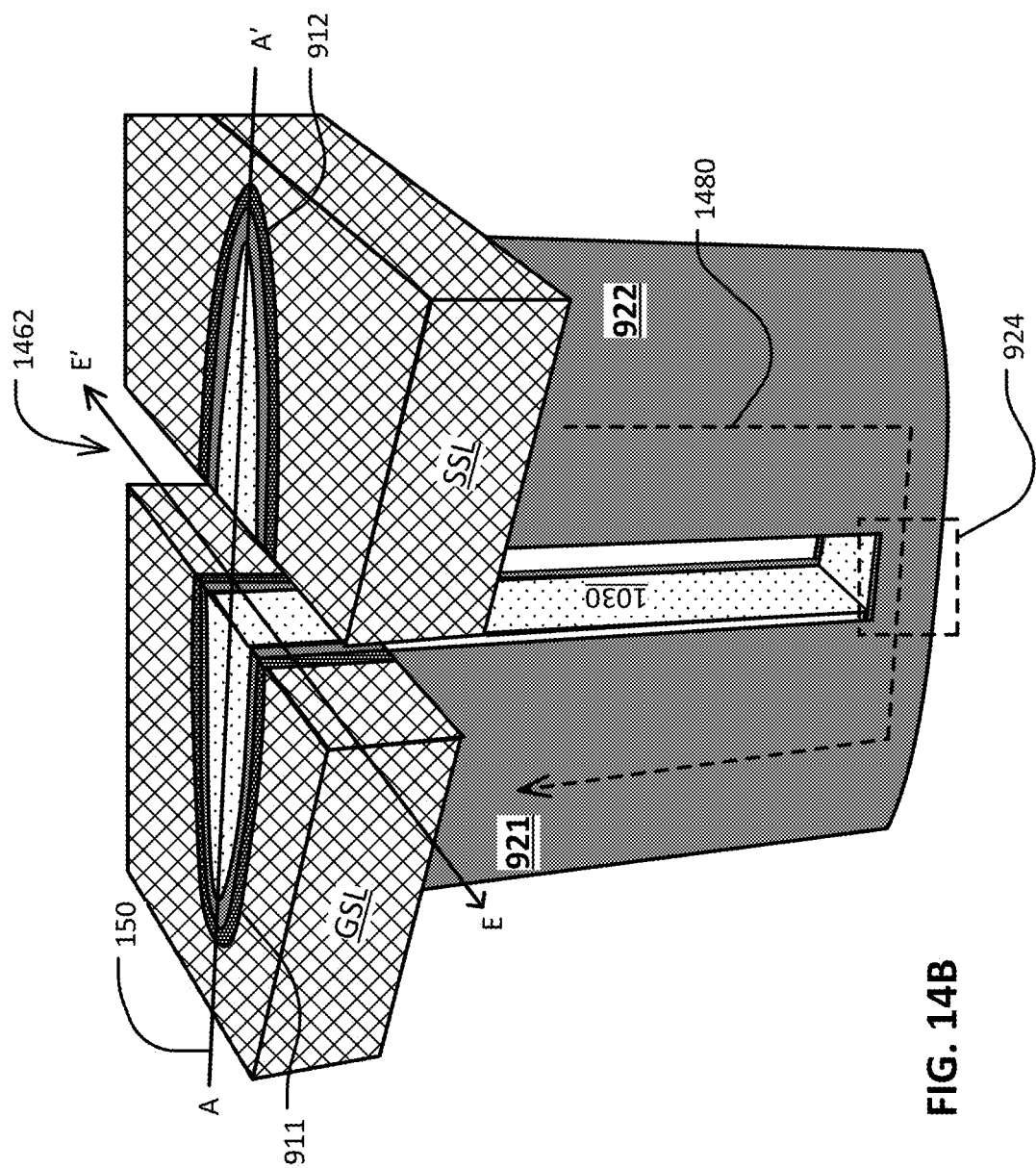

FIG. 14B illustrates a perspective view of a first semiconductor film 921 and a second semiconductor film 922 disposed opposite the first semiconductor film across a slit 1462 along the major axis 150 of an elliptical hole shown along a line A-A'. The slit 1462 is along the line E-E'. The first and second semiconductor films (921, 922) are deposited over and in contact with the first and second data storage structures (911, 912) respectively.

A vertical semiconductor film 924 is disposed beneath the slit 1462 and connected to the first and second semiconductor films 921 and 922. A U-shaped current path 1480 can be formed between the ground select line GSL and the string select line SSL through the first and second semiconductor films (921, 922) and the vertical semiconductor film 924.

FIGS. 15 and 15A illustrate a stage of the process flow after forming a plurality of isolation blocks (1561, 1562) in respective slits (1461, 1462, FIG. 14) in the plurality of slits. FIG. 15A illustrates a vertical cross-section of FIG. 15 taken along the line A-A' shown in FIG. 15.

A particular isolation block 1562 in the plurality of isolation blocks separates a first stack of conductive strips 120 and a second stack of conductive strips 130 in the plurality of stacks of conductive strips. First hemi-cylindrical vertical channel structures (1441, 1442, 1443) in the first stack of conductive strips are in contact with a first side 1562a of the particular isolation block 1562. Second hemi-cylindrical vertical channel structures (1451, 1452, 1453) in the second stack of conductive strips are in contact with a second side 1562b of the particular isolation block opposite the first side of the particular isolation block.

FIGS. 16 and 16A illustrate a stage of the process flow after forming a common source line CSL 560 connected to the first plug 1251 and the top surface of the first semiconductor film 921, and a bit line contact 1652 connected to the second plug 1252 and the top surface of the second semiconductor film 922. FIG. 16A illustrates a vertical cross-section of FIG. 16 taken along the line A-A' shown in FIG. 16. The common source line CSL 560 extends in the first direction (X-direction).

Figure 17:
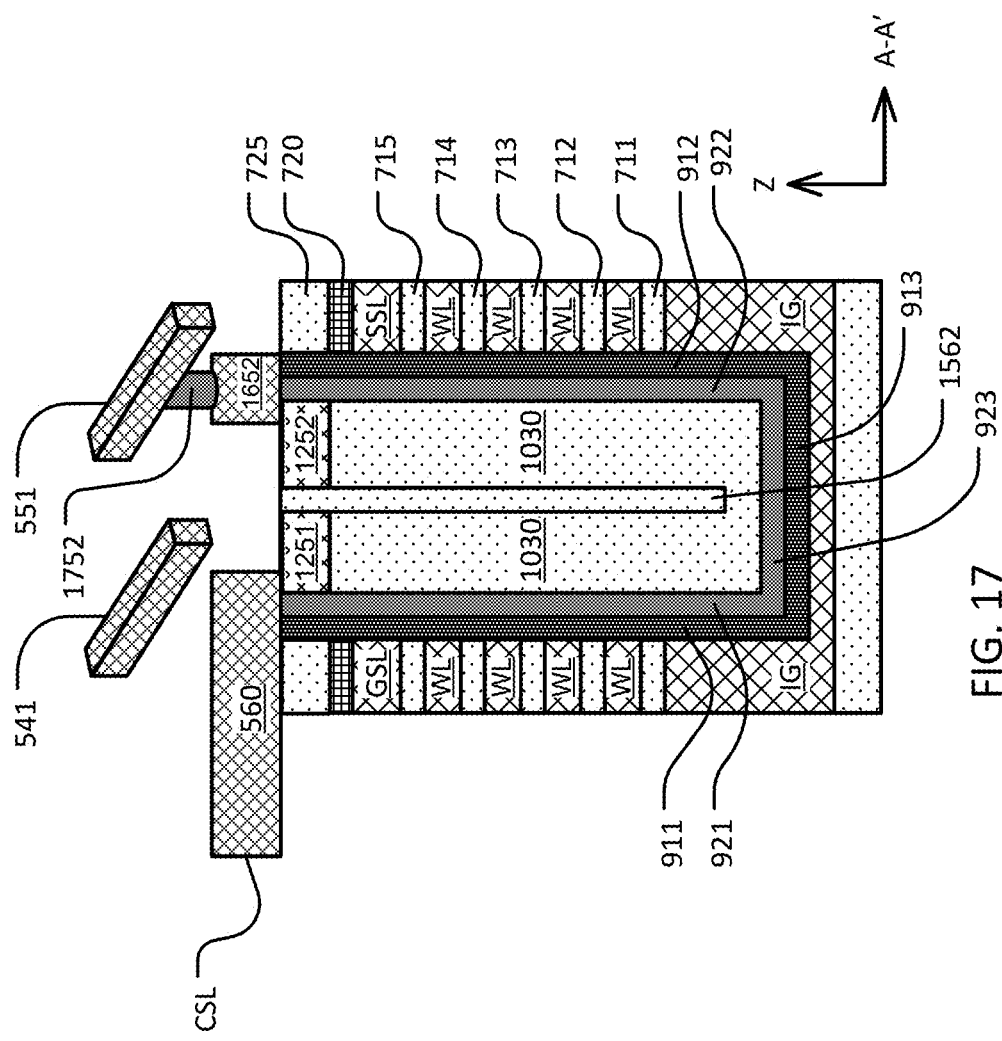

FIG. 17 illustrates a stage of the process flow after forming a via 1752 connected to the bit line contact 1652, which is connected to the second plug 1252 and the top surface of the second semiconductor film 922.

As shown in the example of FIG. 17, the first vertical semiconductor film 921 is disposed opposite the second vertical semiconductor film 922 across the isolation block 1562 along the line A-A'. A common source line CSL can be connected to the first vertical semiconductor film 921. A bit line 551 can be connected to the second vertical semiconductor film 922 via the bit line contact 1652 and the via 1752. A current path can be formed between the common source line CSL and the bit line 551 through the first vertical semiconductor film 921, the horizontal semiconductor film 923 at the bottom of the elliptical hole, and the second vertical semiconductor film 922. Another bit line 541 is disposed over the common source line CSL, but not connected to the common source line CSL. A first set of bit lines 541-544 and a second set of bit lines 551-554 disposed over a common source line 560 disposed above a stack of conductive strips is further described in reference to FIG. 5.

Figure 18:
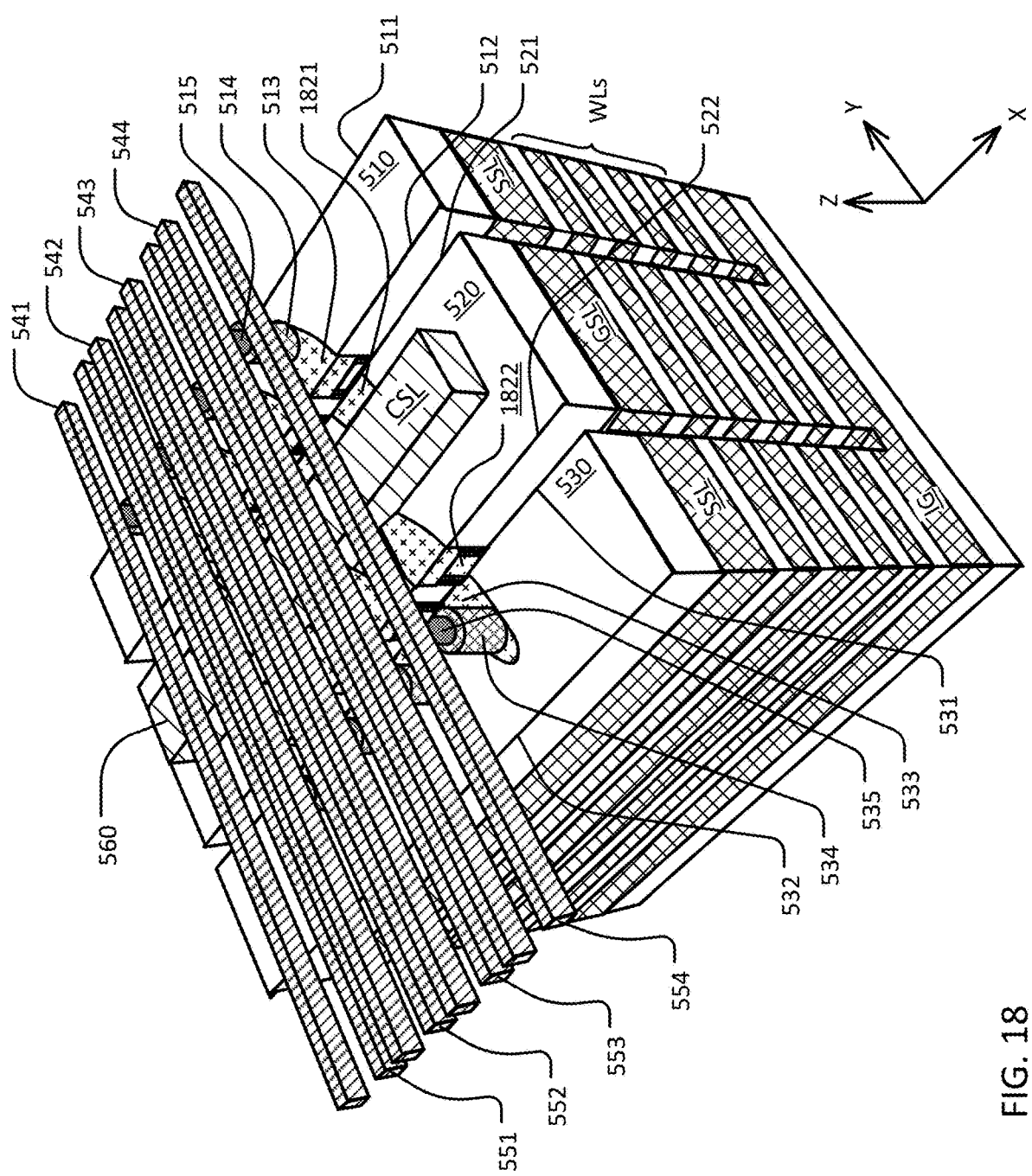

FIG. 18 illustrates a stage of the process flow after forming a common source line, a first set of bit lines, and a second set of bit lines over a plurality of stacks of conductive strips. As shown in the example of FIG. 18, a plurality of stacks of conductive strips includes an even stack of conductive strips 520, a first odd stack of conductive strips 510 disposed on a first side 521 of the even stack, and a second odd stack of conductive strips 530 disposed on a second side 522 of the even stack opposite the first side 521. First hemi-cylindrical vertical channel structures 1821 are disposed on the first side 521 of the even stack of conductive strips 520. Second hemi-cylindrical vertical channel structures 1822 are disposed on the second side 522 of the even stack of conductive strips 520.

A common source line CSL is disposed above the even stack of conductive strips 520, and connected to the first and second hemi-cylindrical vertical channel structures (1821, 1822) on the first and second sides (521, 522) of the even stack of conductive strips 520. The common source line extends in the first direction (X-direction).

A first set of bit lines (541, 542, 543, 544) is connected to the hemi-cylindrical vertical channel structures on a second side 512 of the first odd stack (510) adjacent the first side 521 of the even stack 520, and a second set of bit lines (551, 552, 553, 554) connected to the hemi-cylindrical vertical channel structures on a first side 531 of the second odd stack 530 adjacent the second side 522 of the even stack 520. Bit lines in the first set of bit lines (541, 542, 543, 544) alternate with bit lines in the second set of bit lines (551, 552, 553, 554) in the first direction (X-direction).

A first bit line BL (e.g. 544) in the first set of bit lines can be connected to a hemi-cylindrical vertical channel structure in the first odd stack of conductive strips 510 via a first plug 513, a first contact 514 and a first via 515. A second bit line BL (e.g. 554) in the second set of bit lines can be connected to a hemi-cylindrical vertical channel structure in the second odd stack of conductive strips 530 via a second plug 533, a second contact 534 and a second via 535.

Figure 18A:
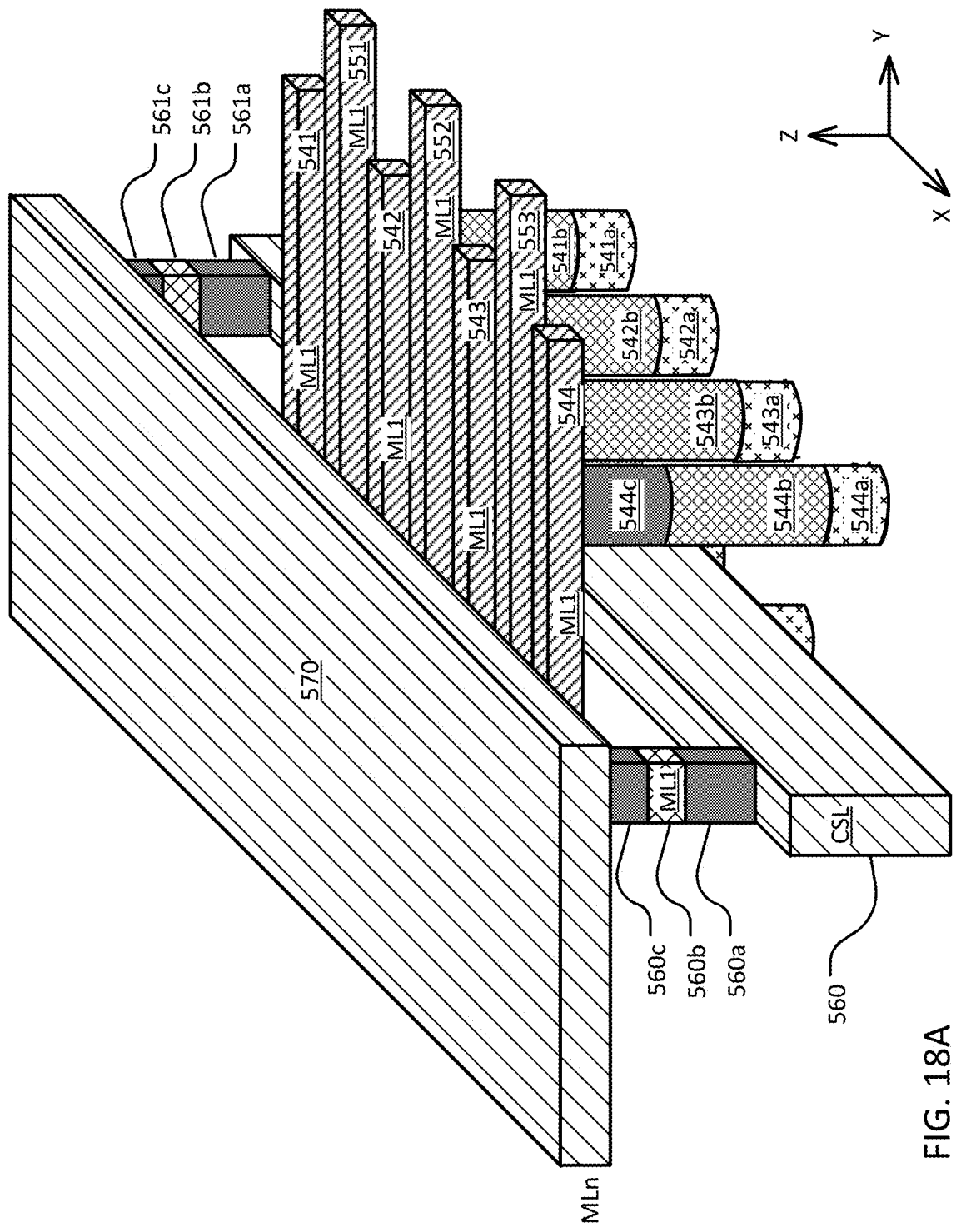
FIG. 18A illustrates example routing of a common source line CSL as shown in FIGS. 5, 17 and 18.

FIG. 18A illustrates example routing of a common source line CSL as shown in FIGS. 5, 17 and 18. A first set of bit lines 541-544 and a second set of bit lines 551-553 can be disposed at a first metal layer ML1. A common source line CSL 560 can be disposed below the first metal layer ML1 and above a stack of conductive strips 520 (FIG. 5). The common source line CSL 560 extends in the first direction (X-direction), while the first and second sets of bit lines extend in the second direction (Y-direction) orthogonal to the first direction.

A strapping region 570 can be disposed at a top metal layer MLn above the first metal layer ML1. In embodiments, there can be one or more other metal layers between the first metal layer ML1 and the top metal layer MLn. The common source line CSL 560 can be connected to the strapping region 570 at the top metal layer MLn on a first side of the first and second sets of bit lines, for example through a first via 560a, a connector 560b at the first metal layer ML1, and a second via 560c. The common source line CSL 560 can be connected to the top metal layer MLn on a second side of the first and second sets of bit lines opposite the first side, for example through a first via 561a, a connector 561b at the first metal layer ML1, and a second via 561c.

Bit lines 541, 542, 543 and 544 in the first set of bit lines can be connected to respective second plugs 541a, 542a, 543a and 544a via respective bit line contacts 541b, 542b, 543b and 544b. Vias (e.g. 544c) are disposed between and contacting bit line contacts (e.g. 544b) and respective bit lines (e.g. 544). The second plugs are connected to the second semiconductor films in the hemi-cylindrical vertical channel structures, as described in reference to FIGS. 16A and 17.

FIG. 19 is an example layout view of an array of cells including hemi-cylindrical vertical channel structures in a first embodiment.

As shown in the example of FIG. 19, a first row 1910 of hemi-cylindrical vertical channel structures, a second row 1920 of hemi-cylindrical vertical channel structures, and a third row 1930 of hemi-cylindrical vertical channel structures are arranged in the first direction (X-direction). Each of the first, second and third rows includes first hemi-cylindrical vertical channel structures disposed on a first side of an isolation block, and second hemi-cylindrical vertical channel structures disposed on a second side of the isolation block opposite the first side in the second direction (Y-direction).

For instance, the first row of hemi-cylindrical vertical channel structures 1910 includes first hemi-cylindrical vertical channel structures (1911-1914) disposed on a first side of an isolation block 1919, and second hemi-cylindrical vertical channel structures (1921-1924) disposed on a second side of the isolation block 1919 opposite the first side. Similarly, the second row of hemi-cylindrical vertical channel structures 1920 includes first hemi-cylindrical vertical channel structures (1931-1934) disposed on a first side of an isolation block 1929, and second hemi-cylindrical vertical channel structures (1941-1944) disposed on a second side of the isolation block 1929 opposite the first side. The third row of hemi-cylindrical vertical channel structures 1930 includes first hemi-cylindrical vertical channel structures (1951-1954) disposed on a first side of an isolation block 1939, and second hemi-cylindrical vertical channel structures (1961-1964) disposed on a second side of the isolation block 1929 opposite the first side.

A row of hemi-cylindrical vertical channel structures (e.g. 1920), including an isolation block (e.g. 1929) separating first hemi-cylindrical vertical channel structures and second hemi-cylindrical vertical channel structures in the row, has a height H in the second direction (Y-direction). In the first embodiment, a height H of a row of elliptical holes is about 180 nm.

A row of hemi-cylindrical vertical channel structures (e.g. 1920) has an X-pitch Xp in the first direction (X-direction) between two adjacent hemi-cylindrical vertical channel structures (e.g. 1931, 1932) on a same side of an isolation block (e.g. 1929). In the first embodiment, an X-pitch Xp is about 140 nm.

Rows of hemi-cylindrical vertical channel structures have a Y-pitch Yp between two adjacent rows of hemi-cylindrical vertical channel structures (e.g. 1910, 1920) in the second direction. In the first embodiment, a Y-pitch Yp is about 220 nm.

Adjacent rows of hemi-cylindrical vertical channel structures (e.g. 1910, 1920) are spaced apart by a first separation width Si in the second direction. In the first embodiment, a first separation width Si is about 40 nm.

Adjacent hemi-cylindrical vertical channel structures (e.g. 1951, 1952) in a row (e.g. 1930) on a same side of an isolation block (e.g. 1939) are spaced apart by a second separation width S2 in a direction orthogonal to the major axis 150. In the first embodiment, a second separation width S2 is about 30 nm. A width of an isolation block Yw in the second direction (Y-direction) can be ranged between 40 nm-60 nm or below 30 nm, depending on the etching capability of the etching tool.

FIG. 19A illustrates the length L and the width W of the hemi-cylindrical vertical channel structures in the first embodiment as shown in FIG. 19. First and second hemi-cylindrical vertical channel structures (e.g. 1934, 1944) disposed across an isolation block (e.g. 1929) along the major axis 150 have a length L along the major axis 150 and a width W orthogonal to the length L. In the first embodiment, a length L is about 250 nm, a width W is about 70 nm, and a ratio of the length L to the width W is about 3.57.

Each of the hemi-cylindrical vertical channel structures has the major axis 150 tilted at an angle α relative to the first direction (X-direction), and a complementary angle θ relative to the second direction (Y-direction). In the first embodiment, an angle α relative to the first direction (X-direction) is 45°, and a complementary angle θ relative to the second direction (Y-direction) is 45°.

Figure 20:
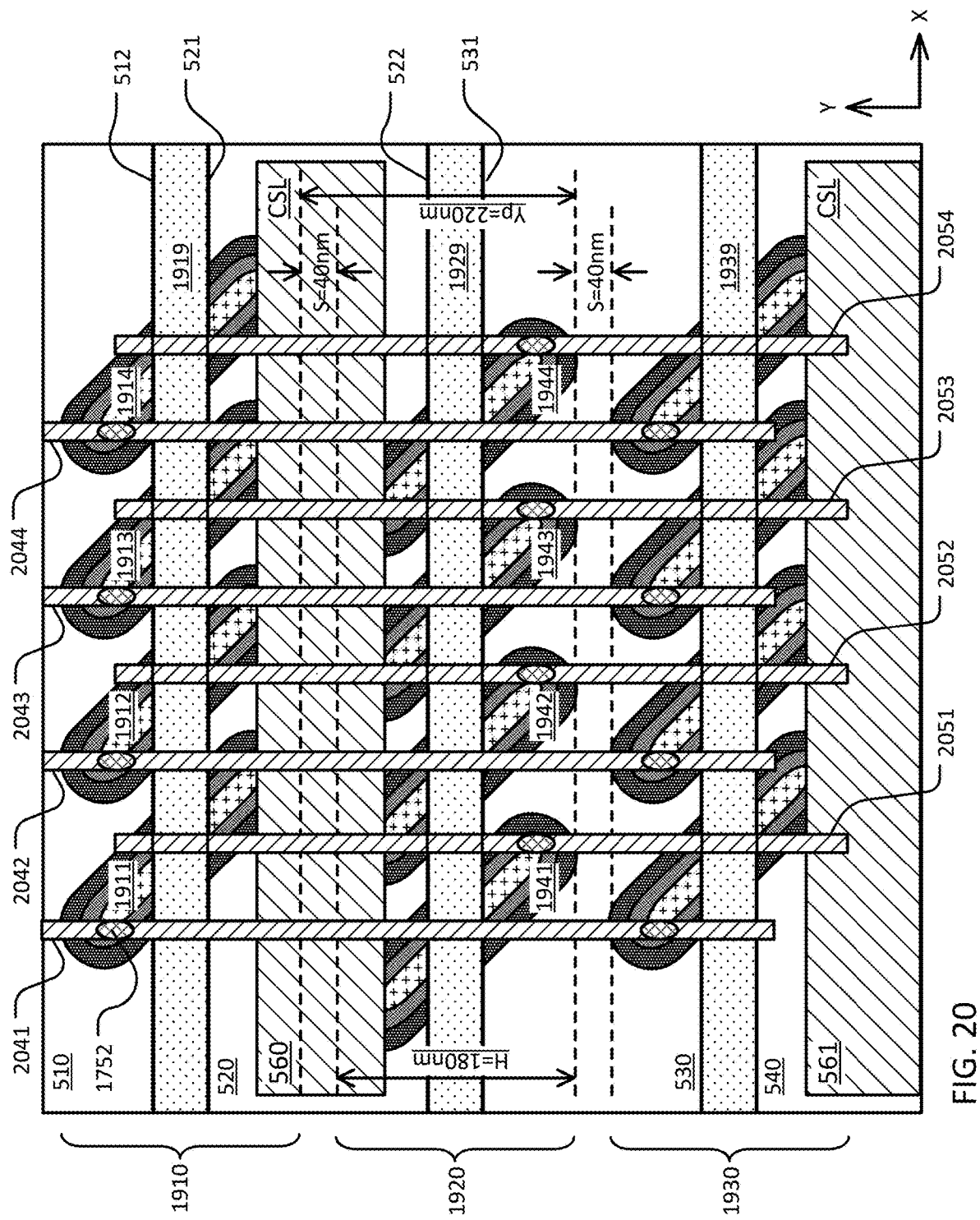
FIG. 20 is an example layout view of an array of cells including hemi-cylindrical vertical channel structures in the first embodiment, including common source lines and bit lines.

FIG. 20 is an example layout view of an array of cells including hemi-cylindrical vertical channel structures in the first embodiment, including common source lines and bit lines. Like elements in FIGS. 19 and 20 are referred to with like reference numerals.

A first odd stack of conductive strips 510 is adjacent a first side 521 of an even stack of conductive strips 520. A second odd stack of conductive strips 530 is adjacent a second side 522 of the even stack 520 opposite the first side 521. The second odd stack of conductive strips 530 is also adjacent a second even stack 540.

A first set of bit lines (2041, 2042, 2043, 2044) is connected to the hemi-cylindrical vertical channel structures (e.g. 1911, 1912, 1913, 1914) on the second side 512 of the first odd stack 510, which is adjacent the first side 521 of the even stack 520. A second set of bit lines (2051, 2052, 2053, 2054) is connected to the hemi-cylindrical vertical channel structures (e.g. 1941, 1942, 1943, 1944) on a first side 531 of the second odd stack 530, which is adjacent the second side 522 of the even stack 520. Bit lines can be connected to hemi-cylindrical vertical channel structure through vias (e.g. 1752), such as described in reference to FIG. 17. Bit lines in the first set of bit lines 2041-2044 alternate with bit lines in the second set of bit lines 2051-2054 in the first direction (X-direction).

A common source line 560 is disposed above the even stack of conductive strips 520, connected to the hemi-cylindrical vertical channel structures on the first side 521 of the stack of conductive strips 520, and connected to the hemi-cylindrical vertical channel structures on the second side 522 of the even stack of conductive strips 520. A second common source line 561 is disposed above the second even stack of conductive strips 540.

Figure 21A:
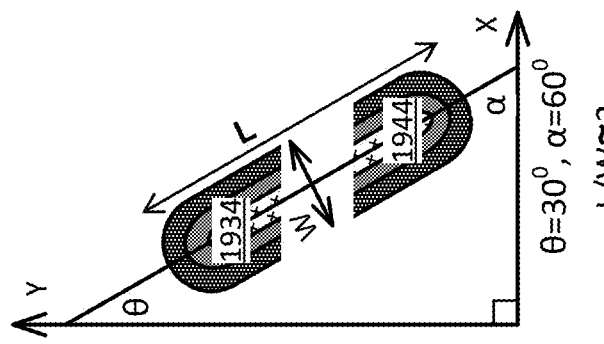
FIG. 21A illustrates the length L and the width W of the hemi-cylindrical vertical channel structures in the second embodiment as shown in FIG. 21.
Figure 21:
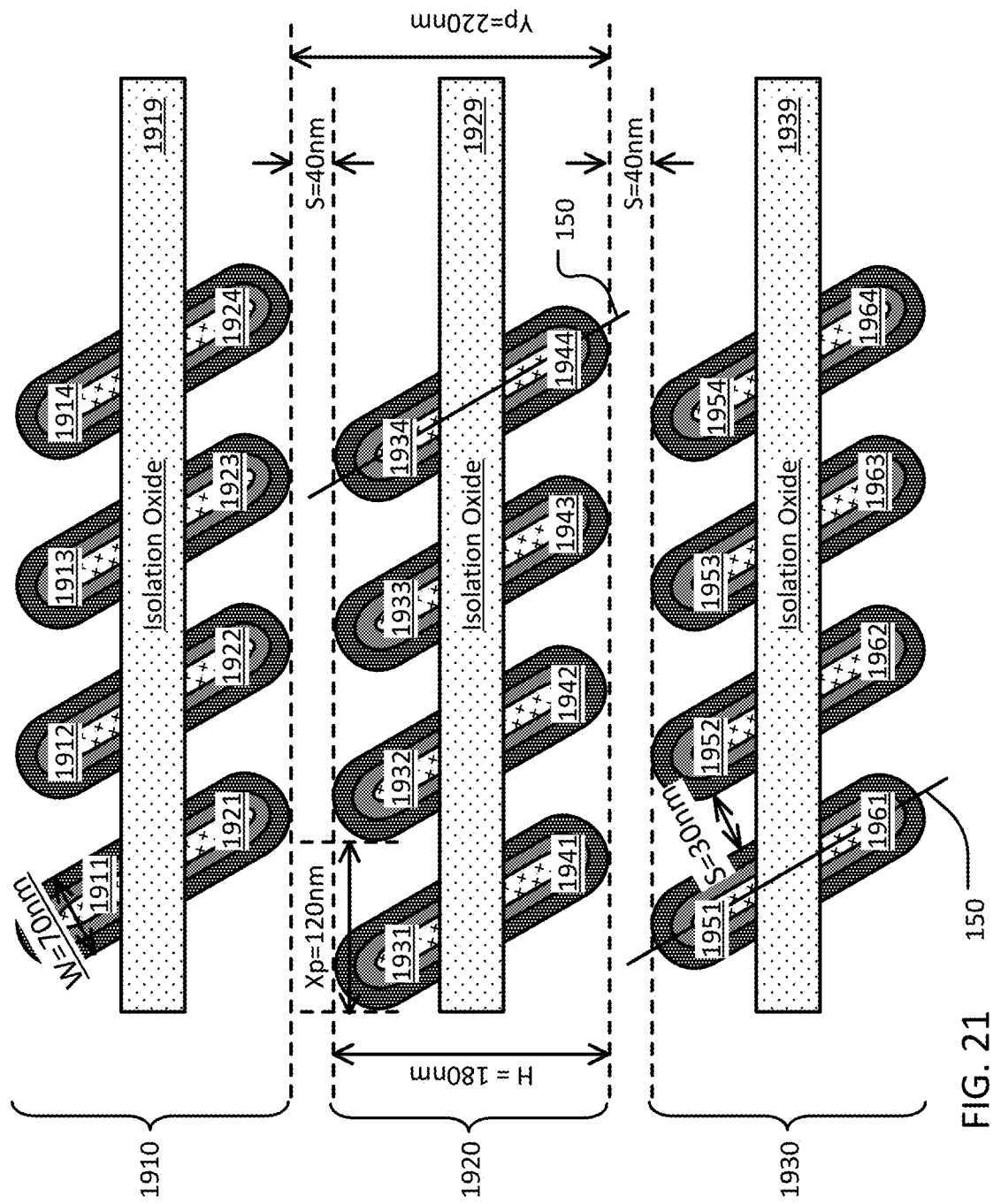
FIG. 21 is an example layout view of an array of cells including hemi-cylindrical vertical channel structures in a second embodiment.

FIG. 21 is an example layout view of an array of cells including hemi-cylindrical vertical channel structures in a second embodiment. Like elements in FIGS. 19 and 21 are referred to with like reference numerals. Description about the layout shown in FIG. 19 is generally applicable to the layout shown in FIG. 21. Differences between the layouts shown in FIGS. 19 and 21 are described below.

In the second embodiment, a row of hemi-cylindrical vertical channel structures (e.g. 1920), including an isolation block (e.g. 1929) separating first hemi-cylindrical vertical channel structures and second hemi-cylindrical vertical channel structures in the row, has a height H of about 220 nm in the second direction (Y-direction).

In the second embodiment, a row of hemi-cylindrical vertical channel structures (e.g. 1920) has an X-pitch Xp of about 120 nm in the first direction (X-direction) between two adjacent hemi-cylindrical vertical channel structures (e.g. 1931, 1932) on a same side of an isolation block (e.g. 1929). Rows of hemi-cylindrical vertical channel structures have a Y-pitch Yp of about 220 nm between two adjacent rows of hemi-cylindrical vertical channel structures (e.g. 1910, 1920) in the second direction.

In the second embodiment, adjacent rows of hemi-cylindrical vertical channel structures (e.g. 1910, 1920) are spaced apart by a first separation width S1 of about 40 nm in the second direction. Adjacent hemi-cylindrical vertical channel structures (e.g. 1951, 1952) in a row (e.g. 1930) on a same side of an isolation block (e.g. 1939) are spaced apart by a second separation width S2 of about 30 nm in a direction orthogonal to the major axis 150.

FIG. 21A illustrates the length L and the width W of the hemi-cylindrical vertical channel structures in the second embodiment as shown in FIG. 21. In the second embodiment, a length L is about 210 nm, a width W is about 70 nm, and a ratio of the length L to the width W is about 3. An angle α relative to the first direction (X-direction) is 60°, and a complementary angle θ relative to the second direction (Y-direction) is 30°.

Figure 22:
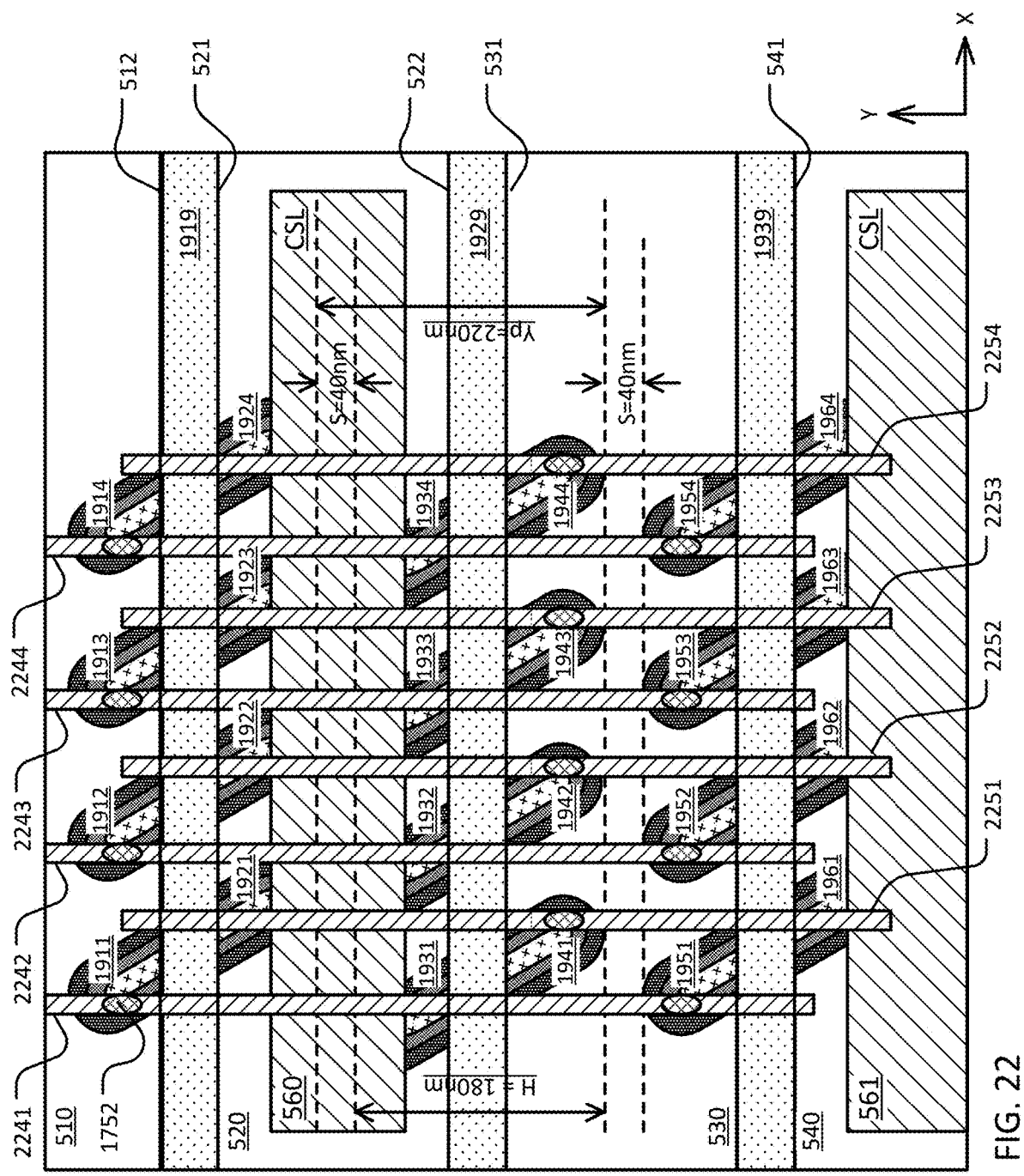
FIG. 22 is an example layout view of an array of cells including hemi-cylindrical vertical channel structures in the second embodiment, including common source lines and bit lines.

FIG. 22 is an example layout view of an array of cells including hemi-cylindrical vertical channel structures in the second embodiment, including common source lines and bit lines. Like elements in FIGS. 21 and 22 are referred to with like reference numerals.

A first odd stack of conductive strips 510 is adjacent a first side 521 of an even stack of conductive strips 520. A second odd stack of conductive strips 530 is adjacent a second side 522 of the even stack 520 opposite the first side 521. The second odd stack of conductive strips 530 is also adjacent the second even stack 540.

A first set of bit lines (2241, 2242, 2243, 2244) is connected to the hemi-cylindrical vertical channel structures (e.g. 1911, 1912, 1913, 1914) on the second side 512 of the first odd stack 510, which is adjacent the first side 521 of the even stack 520. A second set of bit lines (2251, 2252, 2253, 2254) is connected to the hemi-cylindrical vertical channel structures (e.g. 1941, 1942, 1943, 1944) on a first side 531 of the second odd stack 530, which is adjacent the second side 522 of the even stack 520. Bit lines can be connected to hemi-cylindrical vertical channel structure through vias (e.g. 1752), such as described in reference to FIG. 17. Bit lines in the first set of bit lines 2241-2244 alternate with bit lines in the second set of bit lines 2251-2254 in the first direction (X-direction).

A common source line 560 is disposed above the even stack of conductive strips 520, connected to the hemi-cylindrical vertical channel structures on the first side 521 of the stack of conductive strips 520, and connected to the hemi-cylindrical vertical channel structures on the second side 522 of the even stack of conductive strips 520. A second common source line 561 is disposed above the second even stack of conductive strips 540.

Figure 23:
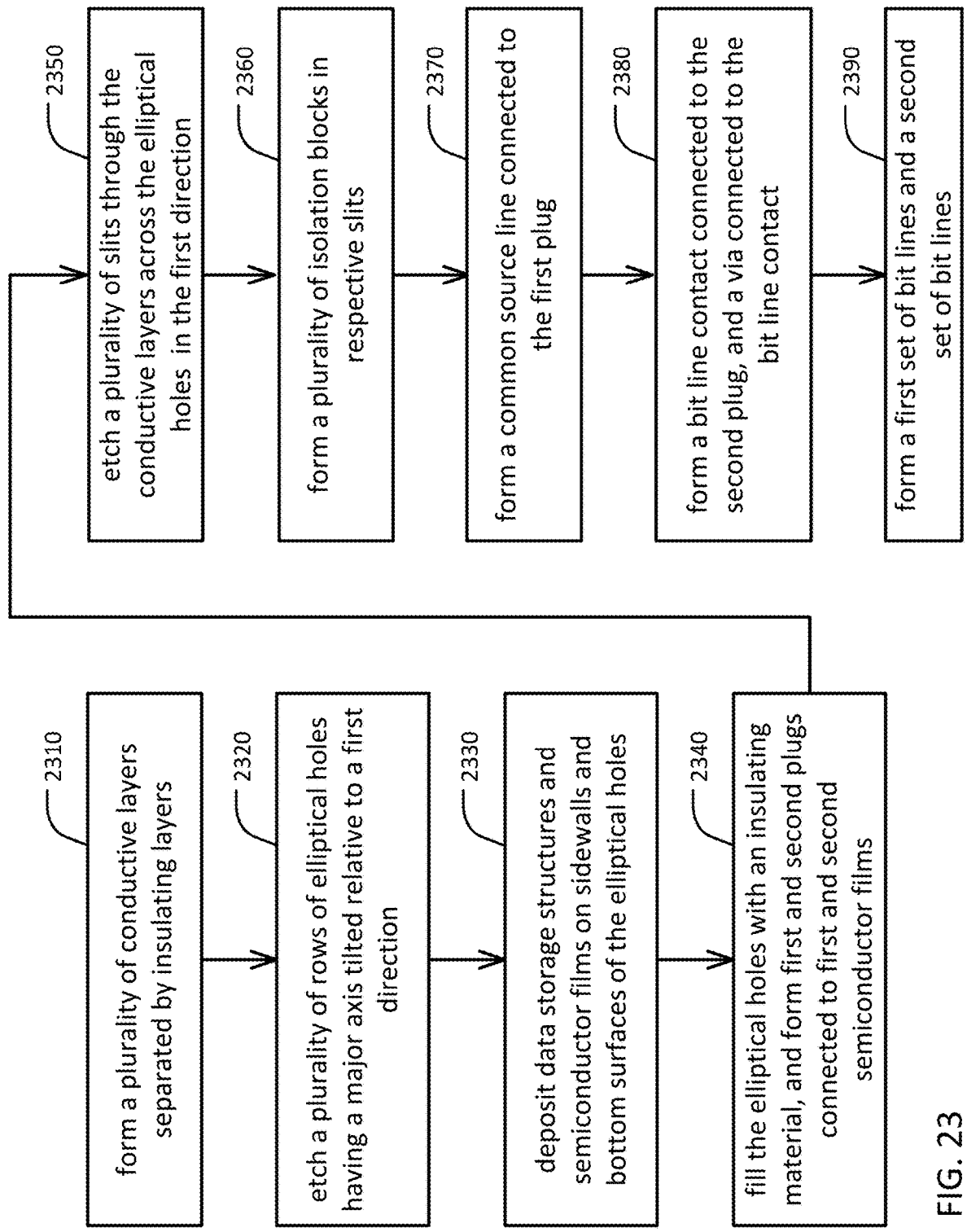
FIG. 23 is a flow chart illustrating a method for manufacturing a memory device including hemi-cylindrical vertical channel structures.

FIG. 23 is a flow chart illustrating a method for manufacturing a memory device including hemi-cylindrical vertical channel structures. At Step 2310, the method includes forming a plurality of conductive layers separated by insulating layers. This step is further described in reference to FIGS. 7 and 7A. At Step 2320, the method includes etching a plurality of rows of elliptical holes in the plurality of conductive layers, where the rows of elliptical holes are arranged in a first direction, and each of the elliptical holes in the rows has a major axis tilted relative to the first direction. This step is further described in reference to FIGS. 8 and 8A.

At Step 2330, the method includes depositing data storage structures and semiconductor films on sidewalls and bottom surfaces of the elliptical holes in the rows. This step is further described in reference to FIGS. 9 and 9A.

At Step 2340, the method includes filling the elliptical holes in the rows with an insulating material, and forming first and second plugs over the top surface of the insulating material in the elliptical holes in the rows, where the first and second plugs are connected to first and second semiconductor films respectively in the elliptical holes in the rows. This step is further described in reference to FIGS. 10-14 and 10A-14A.

At Step 2350, the method includes etching a plurality of slits through the conductive layers across the elliptical holes in respective rows of elliptical holes in the first direction, thereby forming a plurality of stacks of conductive strips and a plurality of hemi-cylindrical vertical channel structures extending through the conductive strips in the stacks, each of the hemi-cylindrical vertical channel structures having a divided elliptical cross section with a major axis tilted relative to the first direction. This step is further described in reference to FIGS. 14, 14A and 14B.

Etching a plurality of rows of elliptical holes (Step 2320) stops at a hole etch level in the bottom conductive layer (875, FIGS. 8, 14A). Etching a plurality of slits (Step 2350) stops at a slit etch level in the bottom conductive layer (1475, FIG. 14A). The slit etch level is below the plurality of intermediate conductive layers and above a horizontal semiconductor film (923, FIG. 14A) disposed over a horizontal layer of data storage structures (913, FIG. 14A) on the bottom surfaces of the elliptical holes in the rows, and the hole etch level is below the horizontal layer of data storage structures.

At Step 2360, the method includes forming a plurality of isolation blocks in respective slits in the plurality of slits, where a particular isolation block in the plurality of isolation blocks separates a first stack of conductive strips and a second stack of conductive strips in the plurality of stacks of conductive strips. First hemi-cylindrical vertical channel structures in the first stack of conductive strips are in contact with a first side of the particular isolation block. Second hemi-cylindrical vertical channel structures in the second stack of conductive strips are in contact with a second side of the particular isolation block opposite the first side of the particular isolation block. This step is further described in reference to FIGS. 15 and 15A.

At Step 2370, the method includes forming a common source line connected to the first plug and the top surface of the first vertical semiconductor film. The common source line CSL is disposed above the even stack of conductive strips, and connected to the hemi-cylindrical vertical channel structures on the first and second sides of the even stack of conductive strips. This step is further described in reference to FIGS. 16, 16A, 17 and 18.

At Step 2380, the method includes forming a bit line contact connected to the second plug and the top surface of the second vertical semiconductor film, forming a via connected to the bit line contact, and forming a bit line connected to the via. This step is further described in reference to FIGS. 16, 16A and 17.

At Step 2390, the method includes forming a first set of bit lines connected to the hemi-cylindrical vertical channel structures on a second side of the first odd stack adjacent the first side of the even stack, and a second set of bit lines connected to the hemi-cylindrical vertical channel structures on a first side of the second odd stack adjacent the second side of the even stack, bit lines in the first set of bit lines alternating with bit lines in the second set of bit lines in the first direction. This step is further described in reference to FIG. 18.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device, comprising:
   a stack of conductive strips separated by insulating strips, the conductive strips in the stack extending in a first direction;

a plurality of hemi-cylindrical vertical channel structures extending through the conductive strips in the stack, each of the hemi-cylindrical vertical channel structures having a divided elliptical cross section with a major axis tilted relative to the first direction; and data storage structures on sidewalls of the conductive strips; and the hemi-cylindrical vertical channel structures comprising semiconductor films having outside surfaces in contact with the data storage structures on the sidewalls of the conductive strips.

2. The memory device of claim 1, wherein the major axis is tilted at an angle relative to the first direction, the angle having a range between 30 degrees and 80 degrees.

3. The memory device of claim 1, wherein the conductive strips in the stack of conductive strips act as tri-gates in contact with the hemi-cylindrical vertical channel structures.

4. The memory device of claim 1, comprising:
a second stack of conductive strips, the conductive strips in the second stack extending in the first direction; and
an isolation block separating the first-mentioned stack of conductive strips and the second stack of conductive strips, first hemi-cylindrical vertical channel structures in the first-mentioned stack of conductive strips in contact with a first side of the isolation block, second hemi-cylindrical vertical channel structures in the second stack of conductive strips in contact with a second side of the isolation block opposite the first side of the isolation block,
wherein the first hemi-cylindrical vertical channel structures are disposed opposite the second hemi-cylindrical vertical channel structures across the isolation block along the major axis.

5. The memory device of claim 4, wherein the first and second hemi-cylindrical vertical channel structures disposed along the major axis have a length along the major axis and a width orthogonal to the length, and a ratio of the length to the width has a range from 3 to 5.

6. The memory device of claim 4, comprising:
a horizontal semiconductor film disposed beneath and connected to the semiconductor films in the first and second hemi-cylindrical vertical channel structures, wherein the horizontal semiconductor film has an elliptical shape having the major axis tilted relative to the first direction.

7. The memory device of claim 4, comprising:
semiconductor films beneath the isolation block and connected to the semiconductor films in the first and second hemi-cylindrical vertical channel structures to form a current path between the first and second hemi-cylindrical vertical channel structures.

8. The memory device of claim 1, wherein the stack of conductive strips includes hemi-cylindrical vertical channel structures on a first side of the stack of conductive strips and on a second side of the stack of conductive strips opposite the first side, comprising:
a common source line disposed above the stack of conductive strips, and connected to the hemi-cylindrical vertical channel structures on the first and second sides of the stack of conductive strips.

9. The memory device of claim 1, comprising:
a plurality of stacks of conductive strips including the first-mentioned stack of conductive strips, a first odd stack in the plurality of stacks being disposed on a first side of an even stack in the plurality of stacks, a second odd stack in the plurality of stacks being disposed on a second side of the even stack opposite the first side; and a first set of bit lines connected to the hemi-cylindrical vertical channel structures on a second side of the first odd stack adjacent the first side of the even stack, and a second set of bit lines connected to the hemi-cylindrical vertical channel structures on a first side of the second odd stack adjacent the second side of the even stack, bit lines in the first set of bit lines alternating with bit lines in the second set of bit lines in the first direction.

10. The memory device of claim 1, comprising:
a plurality of stacks of conductive strips separated by insulating strips, including the first-mentioned stack of conductive strips; and
a plurality of isolation blocks separating adjacent stacks in the plurality of stacks of conductive strips, including a first isolation block, a last isolation block, and intermediate isolation blocks arranged between the first and last isolation blocks in a second direction orthogonal to the first direction,
wherein the first and last isolation blocks have a first width, and the intermediate isolation blocks have a second width, the first width being greater than the second width.

11. A method for manufacturing a memory device, comprising:
forming a plurality of conductive layers separated by insulating layers;
etching a plurality of rows of elliptical holes in the plurality of conductive layers, the rows of elliptical holes arranged in a first direction, each of the elliptical holes in the rows having a major axis tilted relative to the first direction;
depositing data storage structures and semiconductor films on sidewalls and bottom surfaces of the elliptical holes in the rows; and
etching a plurality of slits through the conductive layers across the elliptical holes in respective rows of elliptical holes in the first direction, thereby forming a plurality of stacks of conductive strips and a plurality of hemi-cylindrical vertical channel structures extending through the conductive strips in the stacks, each of the hemi-cylindrical vertical channel structures having a divided elliptical cross section with a major axis tilted relative to the first direction.

12. The method of claim 11, wherein the major axis is tilted at an angle relative to the first direction, the angle having a range between 30 degrees and 80 degrees.

13. The method of claim 11, wherein the plurality of conductive layers includes a bottom conductive layer, a top conductive layer, and a plurality of intermediate conductive layers between the top conductive layer and the bottom layer, the method comprising:
said etching the plurality of rows of elliptical holes stopping at a hole etch level in the bottom conductive layer;
said etching the plurality of slits stopping at a slit etch level in the bottom conductive layer,
wherein the slit etch level is below the plurality of intermediate conductive layers and above a horizontal semiconductor film disposed over a horizontal layer of data storage structures on the bottom surfaces of the elliptical holes in the rows, and the hole etch level is below the horizontal layer of data storage structures.

14. The method of claim 11, comprising:
filling the elliptical holes in the rows with an insulating material;

etching back the insulating material in the elliptical holes in the rows, to form a recess over a top surface of the insulating material in the elliptical holes in the rows, the top surface being higher than a top conductive layer in the plurality of conductive layers;

depositing a conductive material in the recess and over top surfaces of the data storage structures and the semiconductor films; and removing the conductive material above the top surfaces of the data storage structures and the semiconductor films, while leaving the conductive material over the top surface of the insulating material in the elliptical holes in the rows.

15. The method of claim 14, wherein said etching the plurality of slits includes etching the conductive material over the top surface of the insulating material in the elliptical holes in the rows to form first and second plugs over the top surface of the insulating material in the elliptical holes in the rows, the first and second plugs connected to first and second vertical semiconductor films respectively in the elliptical holes in the rows.

16. The method of claim 15, comprising:

forming a common source line connected to the first plug and the top surface of the first vertical semiconductor film, and a bit line contact connected to the second plug and the top surface of the second vertical semiconductor film;

forming a via connected to the bit line contact; and forming a bit line connected to the via.

17. The method of claim 11, comprising:

forming a plurality of isolation blocks in respective slits in the plurality of slits, where a particular isolation block in the plurality of isolation blocks separates a first stack of conductive strips and a second stack of conductive strips in the plurality of stacks of conductive strips, first hemi-cylindrical vertical channel structures in the first stack of conductive strips in contact with a first side of the particular isolation block, second hemi-cylindrical vertical channel structures in the second stack of conductive strips in contact with a second side of the particular isolation block opposite the first side of the particular isolation block.

18. The method of claim 11, wherein the plurality of stacks of conductive strips includes an even stack of conductive strips, a first odd stack of conductive strips disposed on a first side of the even stack, and a second odd stack of conductive strips disposed on a second side of the even stack opposite the first side, and the plurality of hemi-cylindrical vertical channel structures includes hemi-cylindrical vertical channel structures on the first and second sides of the even stack of conductive strips, the method comprising:

forming a common source line disposed above the even stack of conductive strips, and connected to the hemi-cylindrical vertical channel structures on the first and second sides of the even stack of conductive strips, the common source line extending in the first direction.

19. The method of claim 11, wherein the plurality of stacks of conductive strips includes an even stack of conductive strips, a first odd stack of conductive strips disposed on a first side of the even stack, and a second odd stack of conductive strips disposed on a second side of the even stack opposite the first side, the method comprising:

forming a first set of bit lines connected to the hemi-cylindrical vertical channel structures on a second side of the first odd stack adjacent the first side of the even stack, and a second set of bit lines connected to the hemi-cylindrical vertical channel structures on a first side of the second odd stack adjacent the second side of the even stack, bit lines in the first set of bit lines alternating with bit lines in the second set of bit lines in the first direction.

20. A circuit, comprising:

a 3D array of vertical NAND strings of tri-gate memory cells having a hemi-cylindrical vertical channel structure.

* * * * *